(12) United States Patent
Oka

(10) Patent No.: US 12,087,559 B2
(45) Date of Patent: *Sep. 10, 2024

(54) PLASMA PROCESSING APPARATUS, TEMPERATURE CONTROL METHOD, AND TEMPERATURE CONTROL PROGRAM

(71) Applicant: Tokyo Electron Limited, Tokyo (JP)

(72) Inventor: Shinsuke Oka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 6 days.

This patent is subject to a terminal disclaimer.

(21) Appl. No.: 18/073,171

(22) Filed: Dec. 1, 2022

(65) Prior Publication Data

US 2023/0087979 A1  Mar. 23, 2023

Related U.S. Application Data

(63) Continuation of application No. 16/191,545, filed on Nov. 15, 2018, now Pat. No. 11,557,468.

(30) Foreign Application Priority Data

Nov. 16, 2017  (JP) ................................. 2017-221223
Aug. 30, 2018  (JP) ................................. 2018-160931

(51) Int. Cl.
*H01J 37/32* (2006.01)
*H01L 21/67* (2006.01)
*H01L 21/683* (2006.01)

(52) U.S. Cl.
CPC .. *H01J 37/32724* (2013.01); *H01J 37/32009* (2013.01); *H01J 37/32091* (2013.01);

(Continued)

(58) Field of Classification Search
None
See application file for complete search history.

(56) References Cited

U.S. PATENT DOCUMENTS 4,812,712 A   3/1989  Ohnishi et al.
5,584,971 A  12/1996  Komino (Continued)

FOREIGN PATENT DOCUMENTS

JP  2009-302390 A  12/2009
JP  2016-001688 A   1/2016
JP  2017-011169 A   1/2017

*Primary Examiner* — Elizabeth M Kerr
(74) *Attorney, Agent, or Firm* — XSENSUS LLP

(57) ABSTRACT

A heater controller controls power supplied to a heater capable of adjusting the temperature of a placement surface such that the heater reaches a set temperature. A temperature monitor measures the power supplied in the non-ignited state where the plasma is not ignited and in the transient state where the power supplied to the heater decreases after the plasma is ignited, while the power is controlled such that the temperature of the heater becomes constant. A parameter calculator calculates a heat input amount and the thermal resistance by using the power supplied in the non-ignited state and in the transient state to perform a fitting on a calculation model for calculating the power supplied in the transient state. A set temperature calculator calculates the set temperature of the heater at which the wafer reaches the target temperature, using the heat input amount and thermal resistance.

14 Claims, 11 Drawing Sheets

(52) U.S. Cl.
CPC .. *H01J 37/32926* (2013.01); *H01J 37/32935* (2013.01); *H01L 21/67069* (2013.01); *H01L 21/67103* (2013.01); *H01L 21/67109* (2013.01); *H01L 21/67248* (2013.01); *H01L 21/6831* (2013.01)

(56) References Cited

U.S. PATENT DOCUMENTS

| | | | |
|---|---|---|---|
| 7,126,091 | B1 | 10/2006 | Westfall |
| 11,557,468 | B2 * | 1/2023 | Oka .................. H01J 37/32091 |
| 2004/0235304 | A1 | 11/2004 | Oh |
| 2008/0170969 | A1 | 7/2008 | Yoshioka et al. |
| 2010/0096109 | A1 | 4/2010 | Zhang et al. |
| 2010/0240154 | A1 | 9/2010 | Ishida |
| 2010/0243606 | A1 | 9/2010 | Koshimizu et al. |
| 2011/0005686 | A1 | 1/2011 | Tanaka et al. |
| 2011/0143462 | A1 | 6/2011 | Gaff et al. |
| 2013/0161305 | A1 | 6/2013 | Ptasienski et al. |
| 2016/0378092 | A1 * | 12/2016 | Yamamoto .......... H01L 21/6831 700/300 |

\* cited by examiner

PLASMA PROCESSING APPARATUS, TEMPERATURE CONTROL METHOD, AND TEMPERATURE CONTROL PROGRAM

CROSS-REFERENCE TO RELATED APPLICATIONS

This application is a continuation application of U.S. patent application Ser. No. 16/191,545, filed on Nov. 15, 2018, which claims priority from Japanese Patent Application No. 2017-221223, filed Nov. 16, 2017, and Japanese Patent Application No. 2018-160931, filed Aug. 30, 2018, respectively, with the Japan Patent Office, all of which are incorporated herein in their entirety by reference, and priority is claimed to each of the following.

TECHNICAL FIELD

Various aspects and embodiments of the present disclosure relate to a plasma processing apparatus, a temperature control method, and a temperature control program.

BACKGROUND

There has been known a plasma processing apparatus that performs a plasma processing such as, for example, an etching on a workpiece such as, for example, a semiconductor wafer (hereinafter, also referred to as "wafer") using plasma. In this plasma processing apparatus, the temperature of the wafer is an important parameter in the etching process.

Therefore, in the plasma processing apparatus, a method including burying a heater capable of controlling the temperature in a placement table on which a wafer is placed and controlling the temperature of the wafer with the heater has been proposed. In addition, a method of predicting the temperature of a wafer heated by a heater has been proposed. See, for example, Japanese Patent Laid-Open Publication Nos. 2016-001688, 2009-302390, and 2017-011169.

SUMMARY

In an embodiment, a plasma processing apparatus disclosed herein includes a placement table, a heater controller, a power monitor, a parameter calculator, and a set temperature calculator. The placement table is provided with a heater capable of adjusting the temperature of a placement surface on which a workpiece serving as a plasma processing target is placed. The heater controller supplies power to the heater such that the heater reaches a set temperature. The power monitor measures the power supplied to the heater in a non-ignited state where plasma is not ignited and in a transient state where the power supplied to the heater decreases after the plasma is ignited, while the power supplied to the heater is controlled by the heater controller such that a temperature of the heater becomes constant. The parameter calculator calculates a heat input amount from the plasma and a thermal resistance between a workpiece and the heater by using the power measured by the power monitor in the non-ignited state and in the transient state to perform a fitting on a calculation model for calculating the power in the transient state using the heat input amount and the thermal resistance as parameters. The set temperature calculator calculates the set temperature of the heater at which the workpiece reaches a target temperature, by using the heat input amount and the thermal resistance calculated by the parameter calculator.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
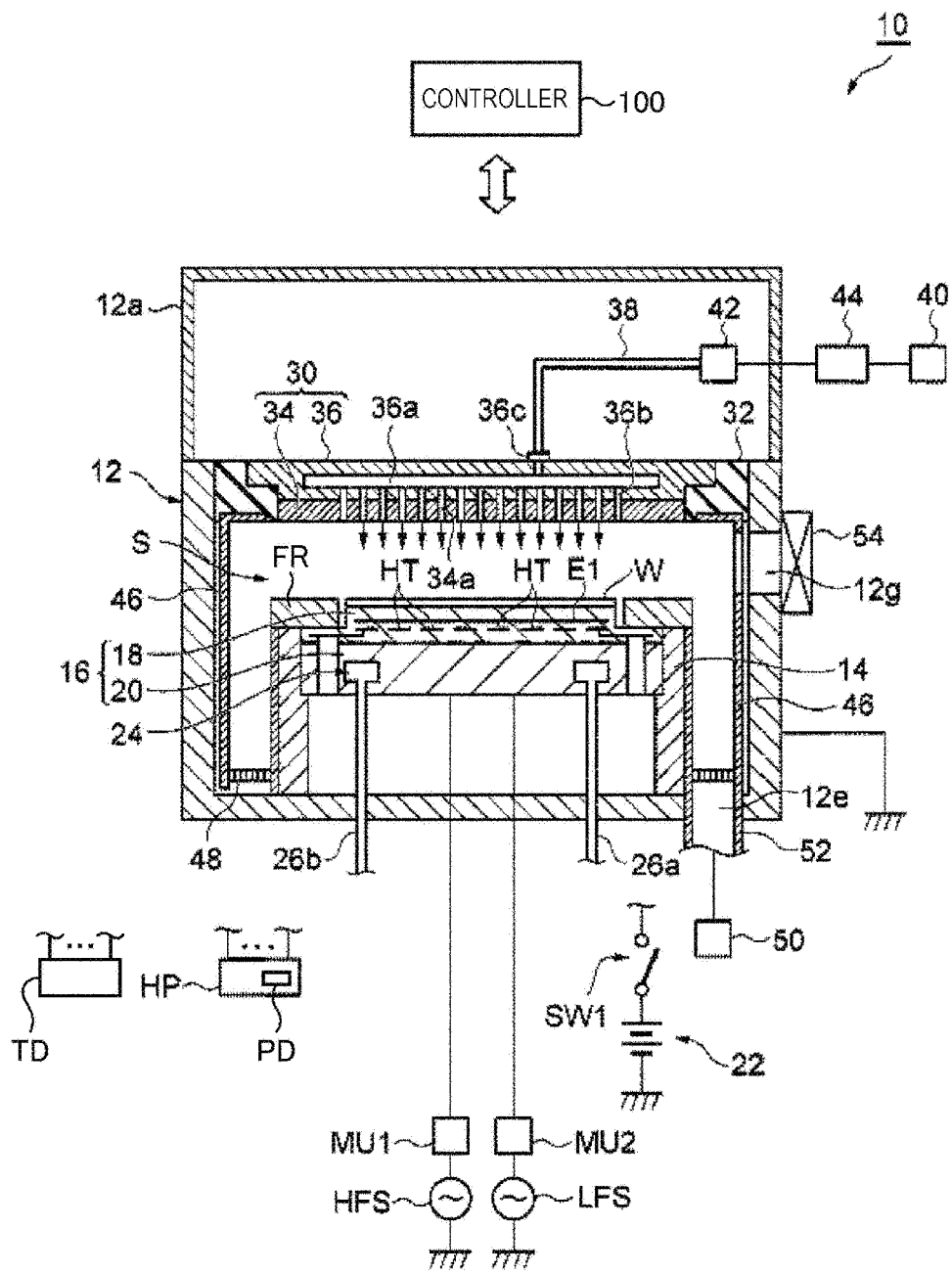
FIG. 1 is a view schematically illustrating a plasma processing apparatus according to a first embodiment.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In a plasma processing, there is heat input from plasma towards a wafer. For this reason, in a plasma processing apparatus, the temperature of the wafer during plasma processing may not be accurately controlled to a target temperature in some cases.

In an embodiment, a plasma processing apparatus disclosed herein includes a placement table, a heater controller, a power monitor, a parameter calculator, and a set temperature calculator. The placement table is provided with a heater capable of adjusting the temperature of a placement surface on which a workpiece serving as a plasma processing target is placed. The heater controller supplies power to the heater such that the heater reaches a set temperature. The power monitor measures the power supplied to the heater in a non-ignited state where plasma is not ignited and in a transient state where the power supplied to the heater decreases after the plasma is ignited, while the power supplied to the heater is controlled by the heater controller such that a temperature of the heater becomes constant. The parameter calculator calculates a heat input amount from the plasma and a thermal resistance between a workpiece and the heater by using the power measured by the power monitor in the non-ignited state and in the transient state to perform a fitting on a calculation model for calculating the power in the transient state using the heat input amount and the thermal resistance as parameters. The set temperature calculator calculates the set temperature of the heater at which the workpiece reaches a target temperature, by using the heat input amount and the thermal resistance calculated by the parameter calculator.

In the above-descried plasma processing apparatus, the heater is individually provided for each divided region of the placement surface of the placement table, the heater controller controls the power supplied for each heater such that the heater provided for each region reaches a set temperature set for each region. The power monitor measures the power supplied in the non-ignited state and the transient state for each heater while the supplied power is controlled by the heater controller such that the temperature becomes constant for each heater. The parameter calculator calculates the heat input amount and the thermal resistance for each heater by performing, for each heater, a fitting on the calculation model using the supplied power of the non-ignited state and the transient state measured by the power monitor. The set temperature calculator calculates, for each heater, the set temperature at which the workpiece reaches the target temperature using the heat input amount and the thermal resistance calculated by the parameter calculator.

In the above-described plasma processing apparatus, the power monitor measures the supplied power in the non-ignited state and in the transient state in a predetermined cycle. The parameter calculator calculates each of the heat input amount and the thermal resistance in every predetermined cycle using the measured supply power in the non-ignited state and the transient state. The plasma processing apparatus further comprises an alarm configured to perform an alert based on a change of at least one of the heat input amount and the thermal resistance calculated by the parameter calculator.

The above-described plasma processing apparatus further includes a storage configured to store the heat input amount and the thermal resistance. The set temperature calculator calculates the set temperature of the heater at which the workpiece reaches the target temperature using the heat input amount and the thermal resistance stored in the storage, and when the set temperature is deviated from a set temperature calculated from the heat input amount and the thermal resistance calculated by the parameter calculator by a predetermined amount or more, the set temperature calculator updates the heat input amount and the thermal resistance stored in the storage unit to the heat input amount and the thermal resistance calculated by the parameter calculation unit.

In another embodiment, a temperature control method disclosed herein includes: measuring power, which is supplied to a heater provided in a placement table and configured to adjust a temperature of a placement surface of the placement table on which a workpiece serving as an plasma processing target is placed, in a non-ignited state where plasma is not ignited and in a transient state where the power supplied to the heater decreases after the plasma is ignited, while the power supplied to the heater is controlled such that the heater becomes a constant temperature; calculating a heat input amount from the plasma and a thermal resistance between a workpiece and the heater by using the measured power supplied in the non-ignited state and in the transient state to perform a fitting on a calculation model for calculating the power supplied in the transient state using the heat input amount and the thermal resistance as parameters; and calculating the set temperature of the heater at which the workpiece reaches a target temperature using the calculated heat input amount and thermal resistance.

In still another embodiment, a non-transitory computer-readable medium that stores a temperature control program is provided. The program causes a computer to execute a temperature control process including: measuring power, which is supplied to a heater provided in a placement table and configured to adjust a temperature of a placement surface of the placement table on which a workpiece serving as an plasma processing target is placed, in a non-ignited state where plasma is not ignited and in a transient state where the power supplied to the heater decreases after the plasma is ignited, while the power supplied to the heater is controlled such that the heater becomes a constant temperature; calculating a heat input amount from the plasma and a thermal resistance between a workpiece and the heater by using the measured power supplied in the non-ignited state and in the transient state to perform a fitting on a calculation model for calculating the power supplied in the transient state using a heat input amount and a thermal resistance as parameters; and calculating the set temperature of the heater at which the workpiece reaches a target temperature using the calculated heat input amount and thermal resistance.

According to an aspect of the plasma processing apparatus disclosed herein, it is possible to accurately control the temperature of a workpiece during a plasma processing to a target temperature.

Hereinafter, embodiments of a plasma processing apparatus, a temperature control method, and a temperature control method disclosed herein will be described in detail with reference to the accompanying drawings. Herein, in each drawing, the same or corresponding components will be denoted by the same symbols. However, the present disclosure is not limited by the embodiments. Respective embodiments may be appropriately combined within a range in which processing contents do not contradict each other.

First Embodiment

[Configuration of Plasma Processing Apparatus]

First, the configuration of a plasma processing apparatus 10 according to an embodiment will be described. FIG. 1 is a view schematically illustrating a plasma processing apparatus according to a first embodiment. FIG. 1 schematically illustrates a structure in a longitudinal cross section of the plasma processing apparatus 10 according to the first embodiment. The plasma processing apparatus 10 illustrated in FIG. 1 is a capacitively coupled parallel plate plasma etching apparatus. The plasma processing apparatus 10 includes a substantially cylindrical processing container 12. The processing container 12 is made of, for example, aluminum. In addition, the surface of the processing container 12 is subjected to an anodic oxidation treatment.

A placement table 16 is provided in the processing container 12. The placement table 16 includes an electrostatic chuck 18 and a base 20. The top surface of the electrostatic chuck 18 serves as a placement surface on which a workpiece to be subjected to a plasma processing is placed. In the present embodiment, a wafer W as a workpiece is placed on the top surface of the electrostatic chuck 18. The base 20 has a substantially disk shape, and its main portion is made of a conductive metal such as, for example, aluminum. The base 20 constitutes a lower electrode. The base 20 is supported by a support unit 14. The support unit 14 is a cylindrical member extending from the bottom portion of the processing container 12.

A first high-frequency power supply HFS is electrically connected to the base 20 via a matching unit MU1. The first high-frequency power supply HFS is a power supply configured to generate high-frequency power for plasma generation, and generates high-frequency power of 27 MHz to 100 MHz (e.g., 40 MHz). Accordingly, plasma is generated just above the base 20. The matching unit MU1 has a circuit configured to match the output impedance of the first high-frequency power supply HFS and a load side (base 20 side) input impedance.

A second high-frequency power supply LFS is electrically connected to the base 20 via a matching unit MU2. The second high-frequency power supply LFS generates high-frequency power (high-frequency bias power) for drawing ions into the wafer W, and supplies the high-frequency bias power to the base 20. Accordingly, a bias potential is generated on the base 20. The frequency of the high-frequency bias power ranges from 400 kHz to 13.56 MHz (e.g., 3 MHz). The matching unit MU2 has a circuit configured to match the output impedance of the second high-frequency power supply LFS and the load side (base 20 side) input impedance.

On the base 20, the electrostatic chuck 18 is provided. The electrostatic chuck 18 attracts the wafer W by electrostatic force such as, for example, Coulomb force so as to hold the wafer W. The electrostatic chuck 18 has an electrode E1 for electrostatic attraction in a main body made of ceramic. A direct current (DC) power supply 22 is electrically connected to the electrode E1 via a switch SW1. The attraction force for holding the wafer W depends on the value of the DC voltage applied from the DC power supply 22.

A focus ring FR is provided on the top surface of the base 20 and around the electrostatic chuck 18. The focus ring FR is provided in order to improve the uniformity of plasma processing. The focus ring FR is made of a material appropriately selected depending on the plasma processing to be performed, and may be made of, for example, silicon or quartz.

Inside the base 20, a coolant flow path 24 is formed. Coolant is supplied to the coolant flow path 24 from a chiller unit provided outside the processing container 12 via a pipe 26a. The coolant supplied to the coolant flow path 24 returns to the chiller unit via a pipe 26b. The details of the placement table 16 including the base 20 and the electrostatic chuck 18 will be described later.

An upper electrode 30 is provided in the processing container 12. The upper electrode 30 is disposed to face the base 20 above the placement table 16, and the base 20 and the upper electrode 30 are provided substantially in parallel to each other.

The upper electrode 30 is supported in the upper portion of the processing container 12 via an insulative blocking member 32. The upper electrode 30 may include an electrode plate 34 and an electrode support 36. The electrode plate 34 faces the processing space S and provides a plurality of gas ejection holes 34a. The electrode plate 34 may be made of a low-resistance conductor or a semiconductor having little Joule heat.

The electrode support 36 detachably supports the electrode plate 34, and may be made of a conductive material such as, for example, aluminum. The electrode support 36 may have a water-cooled structure. Inside the electrode support 36, a gas diffusion chamber 36a is provided. A plurality of gas flow holes 36b communicating with the gas ejection holes 34a extend downward from the gas diffusion chamber 36a. The electrode support 36 is provided with a gas inlet 36c configured to guide a processing gas to the gas diffusion chamber 36a, and a gas supply pipe 38 is connected to the gas inlet 36c.

To the gas supply pipe 38, a gas source group 40 is connected via a valve group 42 and a flow rate controller group 44. The valve group 42 includes a plurality of opening/closing valves, and the flow rate controller group 44 includes a plurality of flow rate controllers such as, for example, mass flow controllers. In addition, the gas source group 40 has gas sources for plural kinds of gases required for a plasma processing. The plurality of gas sources of the gas source group 40 are connected to the gas supply pipe 38 via corresponding opening/closing valves and corresponding mass flow controllers.

In the plasma processing apparatus 10, one or more gases selected from the plurality of gas sources of the gas source group 40 are supplied to the gas supply pipe 38. The gases supplied to the gas supply pipe 38 reach the gas diffusion chamber 36a and are ejected into the processing space S through the gas flow holes 36b and the gas ejection holes 34a.

As illustrated in FIG. 1, the plasma processing apparatus 10 may further include a ground conductor 12a. The ground conductor 12a is a substantially cylindrical ground conductor, and is provided so as to extend from the side wall of the processing chamber 12 to a position higher than the height position of the upper electrode 30.

In the plasma processing apparatus 10, a deposit shield 46 is detachably provided along the inner wall of the processing container 12. The deposit shield 46 is also provided on the outer periphery of the support unit 14. The deposit shield 46 prevents etching byproducts (deposits) from adhering to the processing container 12, and may be configured by coating an aluminum material with ceramics such as $Y_2O_3$.

On the bottom side of the processing vessel 12, an exhaust plate 48 is provided between the support unit 14 and the inner wall of the processing container 12. The exhaust plate 48 may be configured by coating, for example, an aluminum material with ceramics such as, for example, $Y_2O_3$. An exhaust port 12e is provided in the processing container 12 below the exhaust plate 48. An exhaust device 50 is connected to the exhaust port 12e via an exhaust pipe 52. The exhaust device 50 has a vacuum pump such as, for example, a turbo molecular pump, so that the interior of the processing container 12 can be decompressed to a desired degree of vacuum. A carry-in/out port 12g for a wafer W is provided in the sidewall of the processing container 12, and the carry-in/out port 12g is configured to be opened and closed by a gate valve 54.

The operation of the plasma processing apparatus 10 configured as described above is totally controlled by a controller 100. The controller 100 is, for example, a computer, and controls each unit of the plasma processing apparatus 10. The operation of the plasma processing apparatus 10 is totally controlled by the controller 100.

[Configuration of Placement Table]

Figure 2:
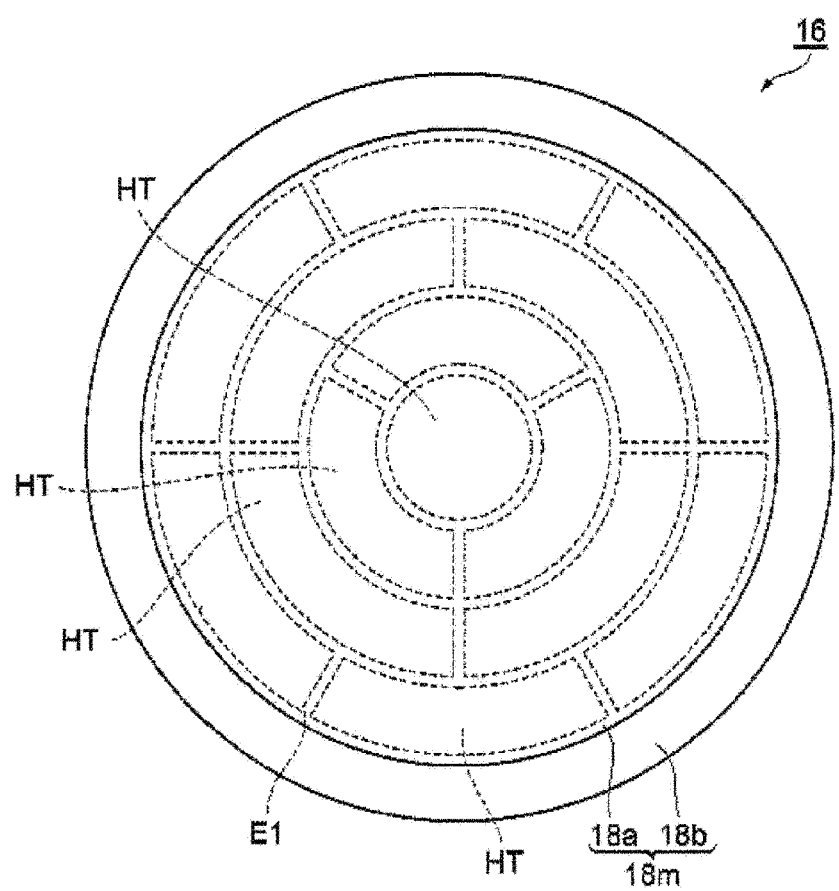
FIG. 2 is a plan view illustrating a placement table according to the first embodiment.

Next, the placement table 16 will be described in detail. FIG. 2 is a plan view showing the placement table according to the first embodiment. As described above, the placement table 16 includes the electrostatic chuck 18 and the base 20. The electrostatic chuck 18 includes a ceramic main body portion 18m. The main body portion 18m has a substantially disk shape. The main body portion 18m provides a placement region 18a and an outer peripheral region 18b. The placement region 18a is a substantially circular region in plan view. A wafer W is placed on the top surface of the placement region 18a. That is, the top surface of the placement region 18a functions as a placement surface on which the wafer W is placed. The diameter of the placement region 18a is substantially the same as the diameter of the wafer W or slightly smaller than the diameter of the wafer W. The outer peripheral region 18b is a region surrounding the placement region 18a and extends substantially in an annular shape. In the present embodiment, the top surface of the outer peripheral region 18b is located lower than the top surface of the placement region 18a.

As illustrated in FIG. 2, the electrostatic chuck 18 has an electrode E1 for electrostatic attraction in the placement region 18a. As described above, the electrode E1 is connected to the DC power supply 22 via the switch SW1.

A plurality of heaters HT are provided in the placement region 18a and below the electrode E1. In the present embodiment, the placement region 18a is divided into a plurality of divided regions, and the heater HT is provided in each divided region. For example, as illustrated in FIG. 2, a plurality of heaters HT are provided in a circular region at the center of the placement region 18a and a plurality of concentric annular regions surrounding the circular region. In each of the plurality of annular regions, a plurality of heaters HT are arranged in the circumferential direction. Here, a method of dividing the divided regions illustrated in FIG. 2 is merely an example, and is not limited thereto. The placement region 18a may be divided into more divided regions. For example, the placement region 18a may be divided into divided regions, the angular widths and radial widths of which are reduced towards the outer circumference. The heaters HT are individually connected to a heater power supply HP illustrated in FIG. 1 via wiring (not illustrated) provided on the outer peripheral portion of the base 20. The heater power supply HP supplies individually adjusted power to each heater HT under the control of the controller 100. Thus, the heat generated by each heater HT is individually controlled, and the temperatures of the plurality of divided regions within the placement region 18a are individually adjusted.

The heater power supply HP is provided with a power detection unit PD configured to detect supply power supplied to each heater HT. The power detection unit PD may be provided in wiring through which power flows from the heater power supply HP to each heater HT, separately from the heater power supply HP. The power detection unit PD detects supply power supplied to each heater HT. For example, the power detection unit PD detects electric energy [W] as the supply power supplied to each heater HT. The heater HT generates heat depending on the electric energy. Therefore, the electric energy supplied to the heater HT indicates heater power. The power detection unit PD notifies the controller 100 of power data indicating the detected supply power supplied to each heater HT.

In the placement table 16, a temperature sensor (not illustrated) capable of detecting the temperature of each heater HT is provided in each divided region of the placement region 18a. The temperature sensor may be an element capable of measuring the temperature separately from the heater HT. Also, using the fact that the temperature sensor is disposed in the wiring through which power supplied to the heater HT flows and the electric resistance of a main metal increases in proportion to a temperature rise, the temperature may be detected from a resistance value obtained by measuring the voltage and current applied to the heater HT. The sensor value detected by each temperature sensor is sent to a temperature measurement device TD. The temperature measurement device TD measures the temperature of each divided region of the placement region 18a from each sensor value. The temperature measurement device TD notifies the controller 100 of temperature data indicating the temperature of each divided region of the placement region 18a.

Further, a heat transfer gas (e.g., He gas) may be supplied between the top surface of the electrostatic chuck 18 and the rear surface of the wafer W by a heat transfer gas supply mechanism and a gas supply line (not illustrated).

[Configuration of Controller]

Figure 3:
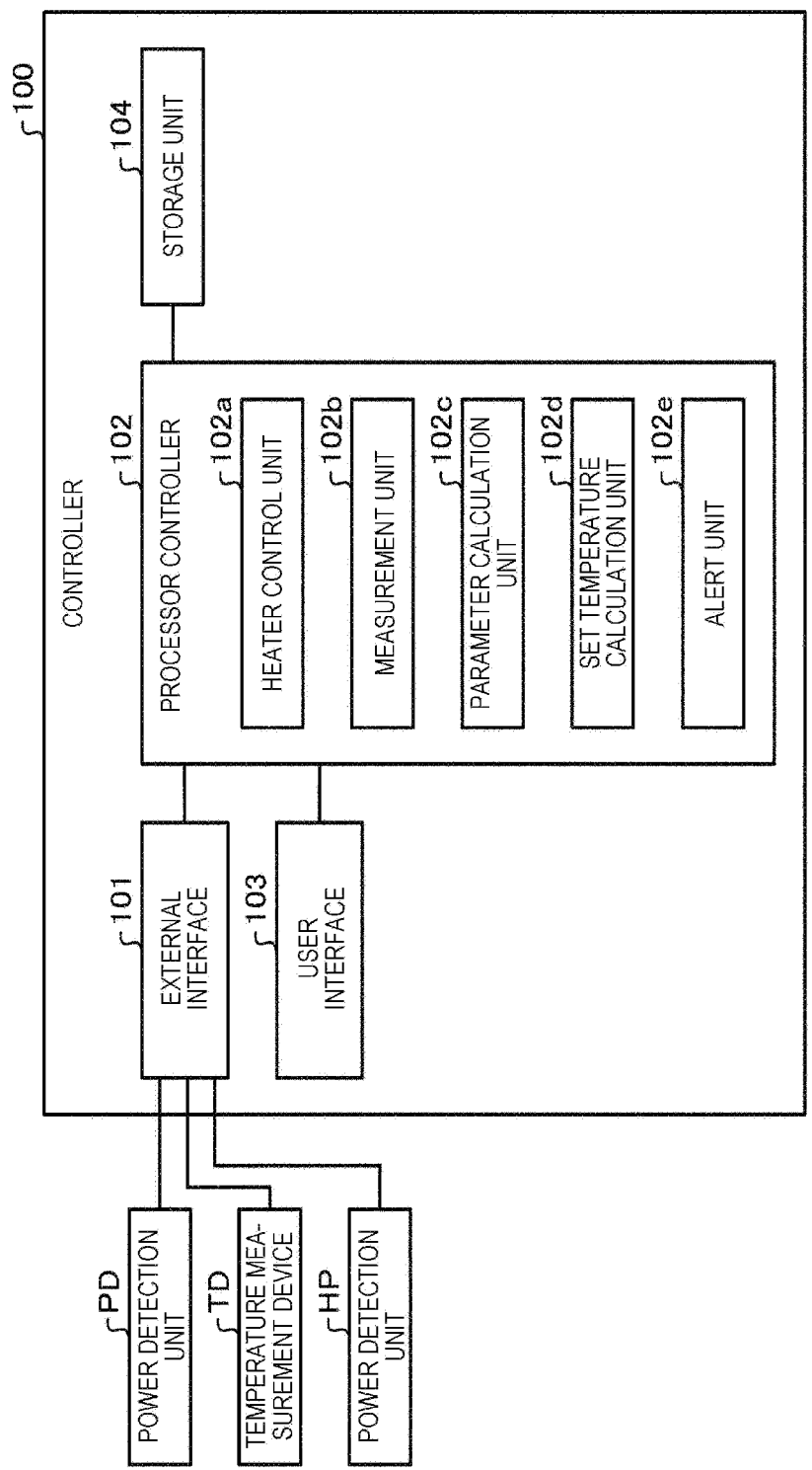
FIG. 3 is a block diagram illustrating a schematic configuration of a controller that controls the plasma processing apparatus according to a first embodiment.

Next, the controller 100 will be described in detail. FIG. 3 is a block diagram illustrating a schematic configuration of a controller that controls the plasma processing apparatus according to the first embodiment. The controller 100 includes an external interface 101, a process controller 102, a user interface 103, and a storage unit 104.

The external interface 101 is capable of communicating with each unit of the plasma processing apparatus 10, and inputs and outputs various sets of data. For example, power data indicating the supply power supplied from the power detection unit PD to each heater HT is input to the external interface 101. In addition, temperature data indicating the temperature of each divided region of the placement region 18a is input from the temperature measurement device TD to the external interface 101. Further, the external interface 101 outputs control data for controlling the supply power supplied to each heater HT to the heater power supply HP.

The process controller 102 includes a central processing unit (CPU) so as to control each unit of the plasma processing apparatus 10.

The user interface 103 includes, for example, a keyboard configured to allow a process manager to input commands for managing the plasma processing apparatus 10 therethrough, and a display configured to visualize and display an operation situation of the plasma processing apparatus 10.

The storage unit 104 stores, for example, a control program (software) for implementing various processes executed in the plasma processing apparatus 10 under the control of the process controller 102, a recipe storing, for example, process condition data, and parameters associated with apparatuses and processes in performing a plasma processing. Further, the control program and the recipe of the processing condition data may be used in the state of being stored in a computer-readable computer-recording medium (e.g., a hard disk, an optical disk such as a DVD, a flexible disk, or a semiconductor memory), or may be transmitted from another device via, for example, a dedicated line at any time so as to be used on-line.

The process controller 102 includes an internal memory that stores programs or data, reads a control program stored in the storage unit 104, and executes a processing of the read control program. The process controller 102 functions as various processing units as the control program operates. For example, the process controller 102 has functions of a heater control unit 102a, a measurement unit 102b, a parameter calculation unit 102c, a set temperature calculation unit 102d, and an alert unit 102e. In the plasma processing apparatus 10 according to the present embodiment, the case where the process controller 102 has the functions of the heater control unit 102a, the measurement unit 102b, the parameter calculation unit 102c, the set temperature calculation unit 102d, and the alert unit 102e is described as an example. However, the functions of the heater control unit 102a, the measurement unit 102b, the parameter calculation unit 102c, the set temperature calculation unit 102d, and the alert unit 102e may be implemented by a plurality of controllers in a distributed manner.

In the plasma processing, the progress of the processing varies depending on the temperature of a wafer W. For example, in plasma etching, the progressing speed of the etching varies depending on the temperature of a wafer W. Therefore, in the plasma processing apparatus 10, it is conceivable to control the temperature of a wafer W to a target temperature using each heater HT.

However, in the plasma processing, there is heat input from the plasma toward the wafer W. For this reason, in the plasma processing apparatus 10, the temperature of a wafer W during the plasma processing may not be accurately controlled to a target temperature in some cases.

Figure 4:
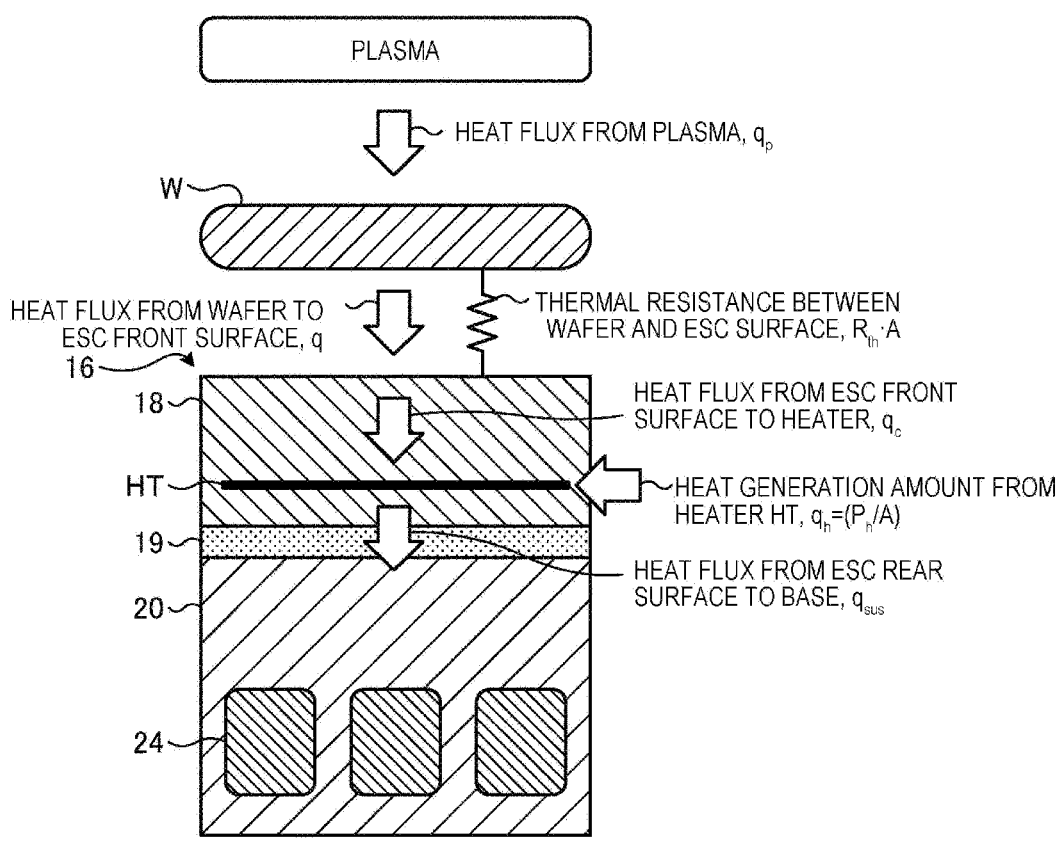
FIG. 4 is a view schematically illustrating a flow of energy that affects the temperature of a wafer.

A flow of energy affecting the temperature of a wafer W will be described. FIG. 4 is a view schematically illustrating a flow of energy that affects the temperature of a wafer. In FIG. 4, a wafer W and a placement table 16 including an electrostatic chuck (ESC) 18 are illustrated in a simplified manner. The example of FIG. 4 illustrates a flow of energy affecting the temperature of the wafer W for one divided region in the placement region 18a of the electrostatic chuck 18. The placement table 16 includes an electrostatic chuck 18 and a base 20. The electrostatic chuck 18 and the base 20 are bonded to each other by an adhesive layer 19. A heater HT is provided inside the placement region 18a of the electrostatic chuck 18. A coolant flow path 24 through which a coolant flows is formed inside the base 20.

The heater HT generates heat depending on the supply power supplied from the heater power supply HP, and the temperature rises. In FIG. 4, the supply power supplied to the heater HT is represented as heater power $P_h$. Further, in the heater HT, a heat generation amount (heat flux) per unit area $q_h$ obtained by dividing the heater power $P_h$ by the area A of the region where the heater HT of the electrostatic chuck 18 is provided is generated.

In addition, when a plasma processing is being performed, the temperature of the wafer W rises due to heat input from the plasma. In FIG. 4, the heat input amount from the plasma is represented as heat flux from the plasma per unit area $q_p$, which is obtained by dividing the heat input amount from the plasma to the wafer W by the area of the wafer W.

It is known that the heat input from the plasma is proportional to the product of the number of ions in the plasma mainly radiated to the wafer W and bias potential for drawing the ions in the plasma into the wafer W. The number of ions in the plasma radiated onto the wafer W is proportional to the electron density of the plasma. The electron density of the plasma is proportional to the power of the high-frequency power HFS from the first high-frequency power supply HFS applied in plasma generation. Also, the electron density of the plasma depends on the pressure in the processing container 12. The bias potential for drawing ions in the plasma into the wafer W is proportional to the power of the high-frequency power LFS from the second high-frequency power supply LFS applied in the generation of bias potential. The bias potential for drawing ions in the plasma into the wafer W depends on the pressure in the processing container 12. Here, when the high-frequency power LFS is not applied to the placement table 12, ions are drawn into the placement table by a difference between the plasma potential which occurs when the plasma is generated and the potential of the placement table 12.

Heat input from the plasma includes, for example, heating by plasma emission, irradiation of the wafer W with electrons and radicals in the plasma, and a surface reaction on the wafer W by the ions and radicals. These components also depend on the power and pressure of alternate current (AC) power. The heat input from the plasma also depends on apparatus parameters associated with plasma generation, for example, the distance between the placement table 16 and the upper electrode 30 and a gas type supplied to the processing space S.

The heat transferred to the wafer W is transferred to the electrostatic chuck 18. Here, not all the heat of the wafer W is transferred to the electrostatic chuck 18, but heat is transferred to the electrostatic chuck 18 depending difficulty in heat transfer, such as the degree of contact between the wafer W and the electrostatic chuck 18. Difficulty in heat transfer, that is, thermal resistance is inversely proportional to the cross-sectional area with respect to the transfer direction of heat. For this reason, in FIG. 4, the difficulty in heat transfer from the wafer W to the surface of the electrostatic chuck 18 is represented as thermal resistance per unit area $R_{th} \cdot A$ between the wafer W and the surface of the electrostatic chuck 18. Here, A is the area of the region in which the heater HT is provided. $R_{th}$ is the thermal resistance in the whole region in which the heater HT is provided. In FIG. 4, the heat input amount from the wafer W to the surface of the electrostatic chuck 18 is represented as the heat flux q per unit area from the wafer W to the surface of the electrostatic chuck 18. In addition, the thermal resistance per unit area $R_{th} \cdot A$ between the wafer W and the surface of the electrostatic chuck 18 depends on the surface condition of the electrostatic chuck 18, the value of the DC voltage applied from the DC power supply 22 in order to hold the wafer W, and the pressure of the heat transfer gas supplied between the top surface of the electrostatic chuck 18 and the rear surface of the wafer W. Further, the thermal resistance $R_{th} \cdot A$ also depends on other device parameters associated with thermal resistance or thermal conductivity.

The heat transferred to the surface of the electrostatic chuck 18 raises the temperature of the electrostatic chuck 18, and is also transferred to the heater HT. In FIG. 4, the heat input amount from the surface of the electrostatic chuck 18 to the heater HT is represented as the heat flux per unit area $q_c$ from the surface of the electrostatic chuck 18 to the heater HT.

On the other hand, the base 20 is cooled by the coolant flowing through the coolant flow path 24, and cools the electrostatic chuck 18 which is in contact therewith. In this case, in FIG. 4, a heat removal amount from the rear surface of the electrostatic chuck 18 to the base 20 through the adhesive layer 19 is represented as heat flux per unit area $q_{sus}$ from the rear surface of the electrostatic chuck 18 to the base 20. As a result, the heater HT is cooled by heat removal, and thus the temperature thereof is lowered.

Figure 5A:
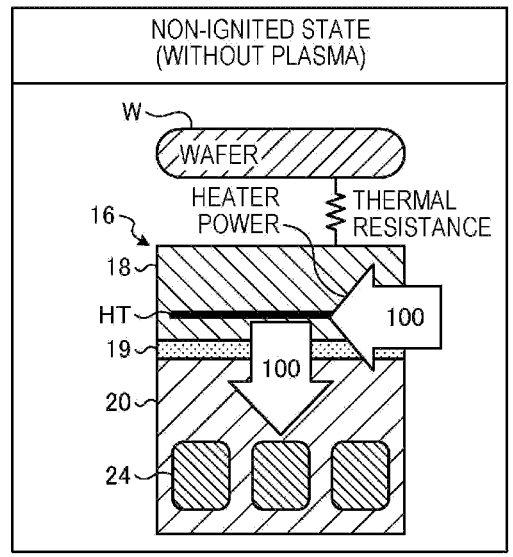
FIG. 5A is a view schematically illustrating a flow of energy in a non-ignited state.

In the case where the temperature of the heater HT is controlled to be constant, the heater HT is in the state where the total sum of the heat input amount transferred to the heater HT and the heat amount generated by the heater HT and the heat removal amount removed from the heater HT are equal to each other. For example, in a non-ignited state in which plasma is not ignited, the heat generation amount generated in the heater HT is equal to the heat removal amount removed from the heater HT. FIG. 5A is a view schematically illustrating a flow of energy in a non-ignited state. In the example of FIG. 5A, a heat amount of "100" is removed from the heater HT by being cooled from the base 20. For example, when the temperature of the heater HT is controlled to be constant, a heat amount of "100" is generated in the heater HT by the heater power $P_h$ supplied from the heater power supply HP.

Figure 5B:
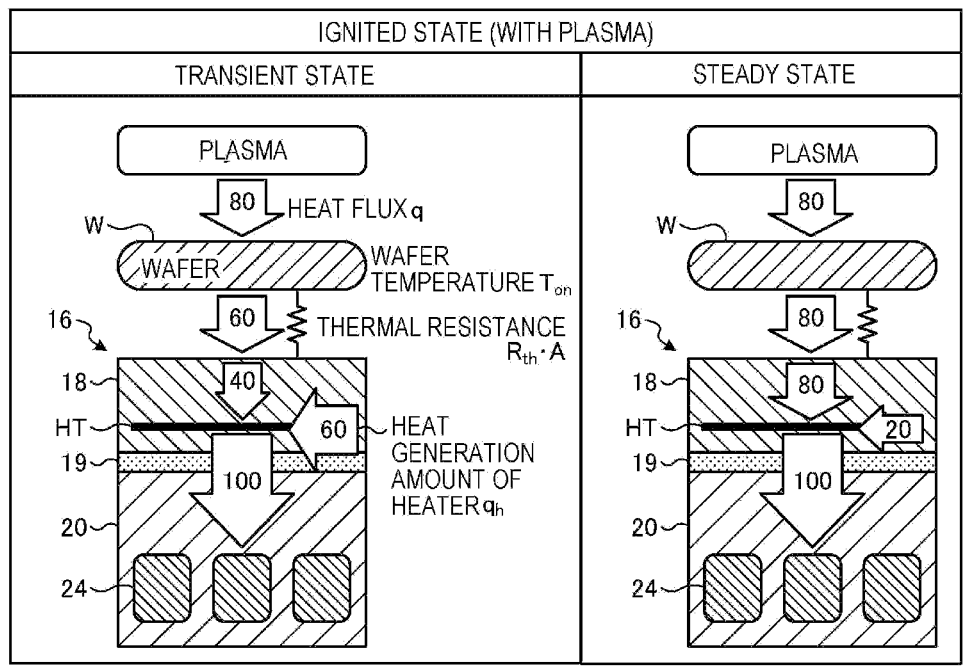
FIG. 5B is a view schematically illustrating flows of energy in an ignited state.

For example, in an ignited state in which plasma is ignited, the total sum of the heat input amount input to the heater HT and the heat amount generated in the heater HT is equal to the heat removal amount removed from the heater HT. FIG. 5B is a view schematically illustrating flows of energy in an ignited state. Here, the ignited state includes a transient state and a steady state. The transient state is the state in which, for example, the heat input amount with respect to the wafer W and the electrostatic chuck 18 is larger than the heat removal amount with respect to the wafer W and the electrostatic chuck 18, and the temperature of the wafer W and the electrostatic chuck 18 tends to rise over time. The steady state is the state in which the heat input amount and the heat removal amount of the wafer W and the electrostatic chuck 18 are equal to each other, the temperature of the wafer W and the electrostatic chuck 18 does not tend to rise over time, and thus the temperature is substantially constant.

Even in the example of FIG. 5B, a heat amount of "100" is removed from the heater HT by being cooled from the base 20. In the ignited state, the temperature of the wafer W rises due to the heat input from the plasma until the wafer W reaches the steady state. Heat is transferred from the wafer W to the heater HT via the electrostatic chuck 18. As described above, when the temperature of the heater HT is controlled to be constant, the heat amount input to the heater HT is equal to the heat amount removed from the heater HT. In the heater HT, the heat amount required to keep the temperature of the heater HT constant decreases. For this reason, the supply power supplied to the heater HT is reduced.

For example, in FIG. 5B, in an example in which "TRANSIENT STATE" is indicated, a heat amount of "80" is transferred from the plasma to the wafer W. The heat transferred to the wafer W is transferred to the electrostatic chuck 18. In addition, when the temperature of the wafer W is not in the steady state, a part of the heat transferred to the wafer W acts on the temperature rise of the wafer W. The heat amount acting on the temperature rise of the wafer W depends on the heat capacity of the wafer W. For this reason, of the heat amount of "80" transferred from the plasma to the wafer W, a heat amount of "60" is transferred from the wafer W to the surface of the electrostatic chuck 18. The heat transferred to the surface of the electrostatic chuck 18 is transferred to the heater HT. Further, when the temperature of the electrostatic chuck 18 is not in the steady state, a part of the heat transferred to the surface of the electrostatic chuck 18 acts on the temperature rise of the electrostatic chuck 18. The heat amount acting on the temperature rise of the electrostatic chuck 18 depends on the heat capacity of the electrostatic chuck 18. For this reason, of the heat amount of "60" transferred to the surface of the electrostatic chuck 18, a heat amount of "40" is transferred to the heater HT. For this reason, when the temperature of the heater HT is controlled to be constant, a heat amount of "60" is supplied to the heater HT by the heater power $P_h$ supplied from the heater power supply HP.

In addition, in FIG. 5B, in an example in which "STEADY STATE" is indicated, a heat amount of "80" is transferred from the plasma to the wafer W. The heat transferred to the wafer W is transferred to the electrostatic chuck 18. Further, when the temperature of the wafer W is in the steady state, the wafer is in the state in which the heat input amount and the heat removal amount are equal to each other. For this reason, the heat amount of "80" transferred from the plasma to the wafer W is transferred from the wafer W to the surface of the electrostatic chuck 18. The heat transferred to the surface of the electrostatic chuck 18 is transferred to the heater HT. When the temperature of the heater HT is in the steady state, the electrostatic chuck 18 is in the state in which the heat input amount and heat removal amount are equal to each other. For this reason, the heat amount of "80" transferred to the surface of the electrostatic chuck 18 is transferred to the heater HT. For this reason, when the temperature of the heater HT is controlled to be constant, a heat amount of "20" is supplied to the heater HT by the heater power $P_h$ supplied from the heater power supply HP.

As illustrated in FIGS. 5A and 5B, the supply power supplied to the heater HT is lower in the ignited state than in the non-ignited state. In the ignited state, the supply power supplied to the heater HT decreases until it reaches the steady state.

Figure 6A:
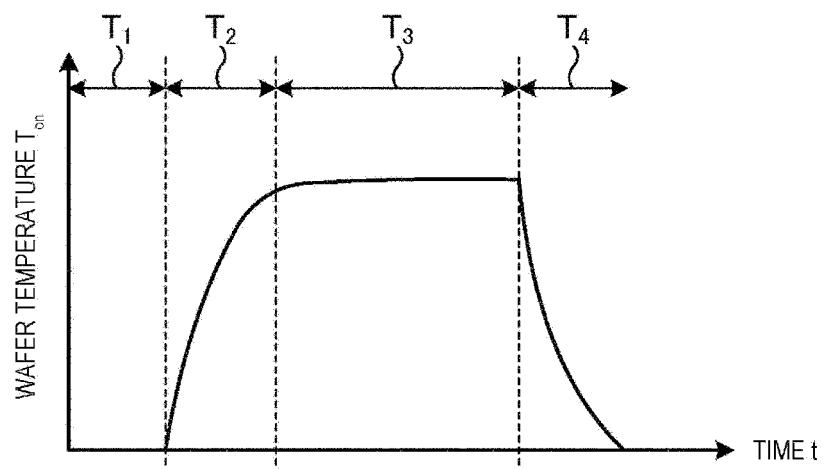
FIGS. 6A and 6B are diagrams representing exemplary changes in a temperature of a wafer and supply power supplied to a heater, respectively.
Figure 6B:
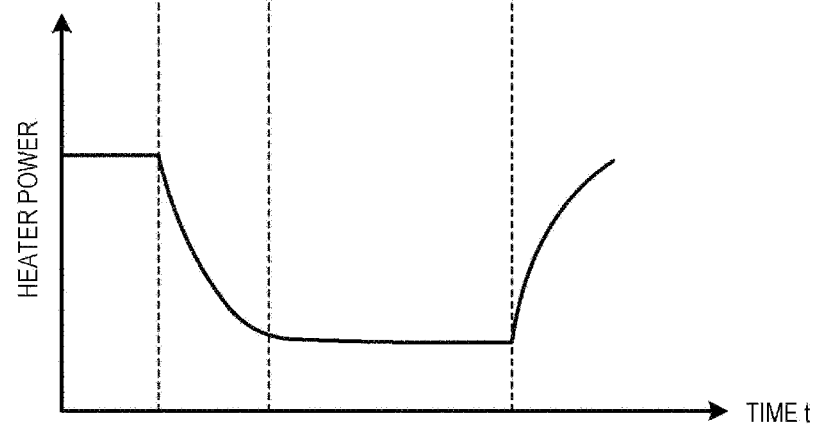

FIGS. 6A and 6B are diagrams representing exemplary changes in a temperature of a wafer and supply power supplied to a heater, respectively. FIG. 6A represents a change in the temperature of the wafer W. FIG. 6B represents a change in the supply power supplied to the heater HT. FIGS. 6A and 6B illustrate results obtained by measuring the temperature of the wafer W and the supply power supplied to the heater in the state in which the temperature of the heater HT is controlled to be constant and thus the plasma is ignited from the non-ignited state in which the plasma is not ignited. The temperature of the wafer W was measured using a temperature measurement wafer such as, for example, Etch Temp sold by KLA-Tencor. This temperature measurement wafer is expensive. For this reason, in a mass production site, when the temperature measurement wafer is used for adjusting the temperature of each heater HT of the plasma processing apparatus 10, the cost increases. For this reason, in a mass production site, when the temperature measurement wafer is used for adjusting the temperature of each heater HT of the plasma processing apparatus 10, the productivity is lowered.

A period T1 in FIGS. 6A and 6B corresponds to a non-ignited state in which plasma is not ignited. In the period T1, the supply power supplied to the heater HT is constant. A period T2 in FIGS. 6A and 6B corresponds to an ignited state in which the plasma is ignited and corresponds to the transient state. In the period T2, the supply power supplied to the heater HT decreases. In addition, in the period T2, the temperature of the wafer W rises to a constant temperature. The period T3 in FIGS. 6A and 6B corresponds to the ignited state in which the plasma is ignited. In the period T3, the temperature of the wafer W is constant and is in the steady state. When the electrostatic chuck 18 is also brought into the steady state, the supply power supplied to the heater HT becomes substantially constant, and fluctuation tending to decrease is stabilized. The period T4 in FIGS. 6A and 6B corresponds to a non-ignited state in which the plasma is turned off. In the period T4, since heat input from the plasma to the wafer W disappears, the temperature of the wafer W decreases and the supply power supplied to the heater HT increases.

The decrease tendency of the supply power supplied to the heater HT in the transient state illustrated in the period T2 in FIGS. 6A and 6B is changed depending on, for example, the heat input amount from the plasma to the wafer W and the thermal resistance between the wafer W and the surface of the electrostatic chuck 18.

Figure 7:
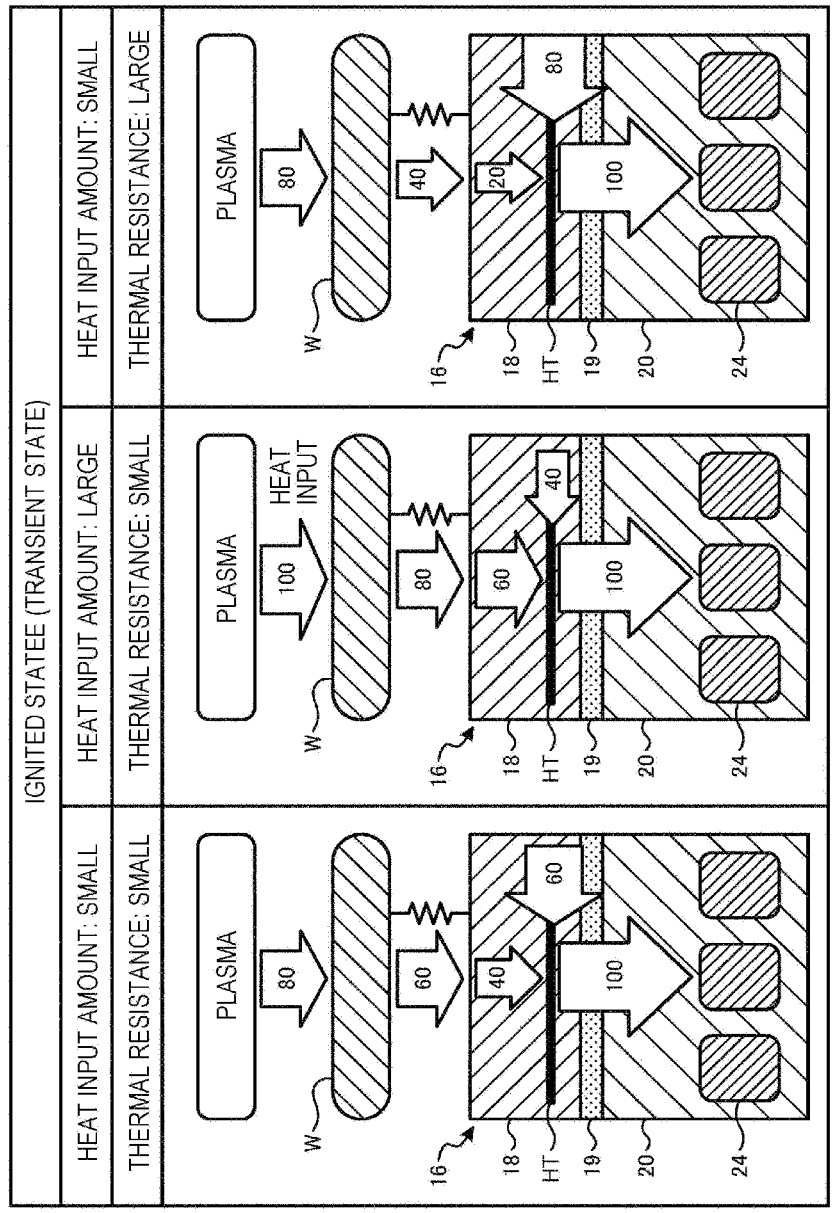
FIG. 7 is a view schematically illustrating flows of energy in an ignited state.

FIG. 7 is a view schematically illustrating flows of energy in an ignited state. In addition, all the examples of FIG. 7 correspond to transient states. For example, in FIG. 7, in an example in which "HEAT INPUT AMOUNT: SMALL, THERMAL RESISTANCE: SMALL" is indicated, a heat amount of "80" is transferred from the plasma to the wafer W. Of the heat amount of "80" transferred from the plasma to the wafer W, a heat amount of "60" is transferred from the wafer W to the surface of the electrostatic chuck 18. In addition, of the heat amount of "60" transferred to the surface of the electrostatic chuck 18, a heat amount of "40" is transferred to the heater HT. For example, when the temperature of the heater HT is controlled to be constant, a heat amount of "60" is supplied to the heater HT by the heater power $P_h$ supplied from the heater power supply HP.

In FIG. 7, in an example in which "HEAT INPUT AMOUNT: LARGE, THERMAL RESISTANCE: SMALL" is indicated, a heat amount of "100" is transferred from the plasma to the wafer W. Of the heat amount of "100" transferred from the plasma to the wafer W, a heat amount of "80" is transferred from the wafer W to the surface of the electrostatic chuck 18. In addition, of the heat amount of "80" transferred to the surface of the electrostatic chuck 18, a heat amount of "60" is transferred to the heater HT. For example, when the temperature of the heater HT is controlled to be constant, a heat amount of "40" is supplied to the heater HT by the heater power $P_h$ supplied from the heater power supply HP.

In FIG. 7, in an example in which "HEAT INPUT AMOUNT: SMALL, THERMAL RESISTANCE: LARGE" is indicated, a heat amount of "80" is transferred from the plasma to the wafer W. Of the heat amount of "80" transferred from the plasma to the wafer W, a heat amount of "40" is transferred from the wafer W to the surface of the electrostatic chuck 18. Of the heat amount of "40" transferred to the surface of the electrostatic chuck 18, a heat amount of "20" is transferred to the heater HT. For example, when the temperature of the heater HT is controlled to be constant, a heat amount of "80" is supplied to the heater HT by the heater power $P_h$ supplied from the heater power supply HP.

In this way, when the temperature of the heater HT is controlled to be constant, the heater power $P_h$ varies depending on the heat input amount from the plasma to the wafer W and the thermal resistance between the wafer W and the surface of the electrostatic chuck 18. Therefore, the decrease tendency of the supply power supplied to the heater HT in the period T2 represented in FIG. 6B varies depending on, for example, the heat input amount from the plasma to the wafer W and the thermal resistance between the wafer W and the surface of the electrostatic chuck 18. For this reason, the graph of the supply power supplied to the heater HT in the period T2 may be modeled using the heat input amount from the plasma to the wafer W and the thermal resistance between the wafer W and the surface of the electrostatic chuck 18 as parameters. That is, the change of the supply power supplied to the heater HT in the period T2 may be modeled by an arithmetic equation using the heat input amount from the plasma to the wafer W and the thermal resistance between the wafer W and the surface of the electrostatic chuck 18 as parameters.

In the present embodiment, a change in the supply power supplied to the heater HT in the period T2 represented in FIG. 6B is modeled as an equation per unit area. For example, a heat generation amount per unit area from the heater HT when there is heat flux from the plasma, $q_h$, the heat generation amount per unit area from the heater HT in a steady state when there is no heat flux from the plasma, $q_{h0}$, and the thermal resistance per unit area between the surface of the electrostatic chuck 18 and the heater, $R_{thc} \cdot A$, may be expressed by Equations (2) to (4) as follows. When $a_1$, $a_2$, $a_3$, $\lambda_1$, $\lambda_2$, $\tau_1$, and $\tau_2$ are expressed by Equations (5) to (11) as follows using the heat flux from the plasma per unit area to the wafer W, $q_p$, and the thermal resistance per unit area between the wafer W and the surface of the electrostatic chuck 18, $R_{th} \cdot A$, as parameters, the heat generation amount per unit area from the heater HT when there is heat flux from the plasma, $q_h$, may be expressed by Equation (1) as follows.

$$q_h = q_{h0} - q_P - \frac{R_{th} \cdot A \cdot q_P}{R_{thc} \cdot A \cdot (\lambda_1 - \lambda_2)} \left\{ \left(1 + \frac{a_2 + a_3}{a_1 \cdot a_3} \cdot \lambda_2\right)(a_1 + \lambda_1)\exp\left(-\frac{t}{\tau_1}\right) - \left(1 + \frac{a_2 + a_3}{a_1 \cdot a_3} \cdot \lambda_1\right)(a_1 + \lambda_2)\exp\left(-\frac{t}{\tau_2}\right) \right\} \quad (1)$$

$$q_h = P_h/A \quad (2)$$

$$q_{h0} = P_{h0}/A \quad (3)$$

$$R_{thc} \cdot A = \frac{z_c}{\kappa_c} \quad (4)$$

$$a_1 = \frac{1}{\rho_w \cdot C_w \cdot z_w \cdot R_{th} \cdot A} \quad (5)$$

$$a_2 = \frac{2}{\rho_c \cdot C_c \cdot z_c \cdot R_{th} \cdot A} \quad (6)$$

$$a_3 = \frac{2}{\rho_c \cdot C_c \cdot z_c \cdot R_{thc} \cdot A} \quad (7)$$

$$\lambda_1 = \frac{1}{2}\left\{-(a_1 + a_2 + a_3) + \sqrt{(a_1 + a_2 + a_3)^2 - 4a_1 a_3}\right\} \quad (8)$$

$$\lambda_2 = \frac{1}{2}\left\{-(a_1 + a_2 + a_3) - \sqrt{(a_1 + a_2 + a_3)^2 - 4a_1 a_3}\right\} \quad (9)$$

$$\tau_1 = -\frac{1}{\lambda_1} \quad (10)$$

$$\tau_2 = -\frac{1}{\lambda_2} \quad (11)$$

Here, $P_h$ is heater power [W] when there is heat flux from the plasma.

$P_{h0}$ is heater power [W] in the steady state when there is no heat flux from the plasma.

$q_h$ is a heat generation amount per unit area [W/m²] from the heater HT when there is heat flux from the plasma.

$q_{h0}$ is a heat generation amount per unit area [W/m²] from the heater HT in the steady state when there is no heat flux from the plasma.

$q_p$ is heat flux per unit area [W/m²] from the plasma to the wafer W.

$R_{th} \cdot A$ is thermal resistance per unit area [K·m²/W] between the wafer W and the surface of the electrostatic chuck 18.

$R_{thc} \cdot A$ is thermal resistance per unit area [K·m²/W] between the surface of the electrostatic chuck 18 and the heater.

A is an area [m²] of a region where the heater is provided.

$\rho_w$ is density of the wafer W [kg/m³].

$C_w$ is heat capacity per unit area [J/K·m²] of the wafer W.

$z_w$ is thickness [m] of the wafer W.

$\rho_c$ is density [kg/m³] of a ceramic constituting the electrostatic chuck 18.

$C_c$ is heat capacity per unit area [J/K·m²] of the ceramic constituting the electrostatic chuck 18.

$z_c$ is a distance [m] from the surface of the electrostatic chuck 18 to the heater HT.

$K_c$ is thermal conductivity [W/K·m] of the ceramic constituting the electrostatic chuck 18.

t is an elapsed time [sec] after igniting the plasma.

With respect to $a_1$ represented by Equation (5), $1/a_1$ is a time constant indicating the difficulty of warming the wafer W. With respect to $a_2$ represented by Equation (6), $1/a_2$ is a time constant indicating the difficulty of heat input and difficulty of warming of the electrostatic chuck 18. With respect to $a_3$ represented by Equation (7), $1/a_3$ is a time constant indicating the difficulty of penetration of heat and difficulty of warming of the electrostatic chuck 18.

Each of the area A of the heater HT, the density of the wafer W, $\rho_w$, the heat capacity per unit area of the wafer W, $C_w$, the thickness $z_w$ of the wafer W the density pc of the ceramic constituting the electrostatic chuck 18, the heat capacity per unit area of the ceramic, $C_c$, constituting the electrostatic chuck 18, the distance $z_c$ from the surface of the electrostatic chuck 18 to the heater HT and the thermal conductivity $\kappa_c$ of the ceramic constituting the electrostatic chuck 18 is predetermined based on the actual configuration of the wafer W or the plasma processing apparatus 10. $R_{thc} \cdot A$ is predetermined from Equation (4) based on the thermal conductivity $\kappa_c$ and the distance $z_c$.

The heater power when there is heat flux from the plasma for each elapsed time t after igniting the plasma, $P_h$, and the heater power in the steady state when there is no heat flux from the plasma, $P_{h0}$, may be obtained through a measurement using the plasma processing apparatus 10. Then, as represented by Equations (2) and (3), by dividing each of the obtained heater power $P_h$ and heater power $P_{h0}$ by the area A of the heater HT, it is possible to obtain the heat generation amount per unit area from the heater HT when there is heat flux from the plasma, $q_h$, and the heat generation amount per unit area from the heater HT in the steady state when there is no heat flux from the plasma, $q_{h0}$.

Then, it is possible to obtain the heat flux per unit area from the plasma to the wafer W, $q_p$, and the thermal resistance per unit area between the wafer W and the surface of the electrostatic chuck 18, $R_{th} \cdot A$, by performing fitting on Equation (1) using a measurement result.

The graph of the temperature of the wafer W in the period T2 represented in FIG. 6A may also be modeled using the heat input amount from the plasma to the wafer W and the thermal resistance between the wafer W and the surface of the electrostatic chuck 18 as parameters. In the present embodiment, the change in the temperature of the wafer W in the period T2 is modeled as an equation per unit area. For example, when $a_1$, $a_2$, $a_3$, $\lambda_1$, $\lambda_2$, $\tau_1$, and $\tau_2$ represented by Equations (5) to (11) are used with the heat flux per unit area from the plasma to the wafer W, $q_p$, and the thermal resistance per unit area between the wafer W and the surface of the electrostatic chuck 18, $R_{th} \cdot A$, as parameters, the temperature $T_W$ [° C.] of the wafer W may be expressed by Equation (12) as follows.

$$T_w = T_h + q_p \cdot (R_{th} \cdot A + R_{thc} \cdot A) + \frac{q_P}{\rho_w \cdot C_w \cdot z_w \cdot (\lambda_1 - \lambda_2)} \left\{ \left(1 + \frac{a_2 + a_3}{a_1 \cdot a_3} \cdot \lambda_2\right) \exp\left(-\frac{t}{\tau_1}\right) - \left(1 + \frac{a_2 + a_3}{a_1 \cdot a_3} \cdot \lambda_1\right) \exp\left(-\frac{t}{\tau_2}\right) \right\} \quad (12)$$

Here, $T_w$ is the temperature [° C.] of the wafer W.

$T_h$ is the temperature [° C.] of the heater HT controlled to be constant.

The temperature $T_h$ of the heater may be obtained from the condition when actually controlling the temperature of the wafer W to be constant.

When the heat flux $q_p$ and the thermal resistance $R_{th} \cdot A$ are obtained by performing the fitting on Equation (1) using a measurement result, the temperature $T_W$ of the wafer W may be calculated from Equation (12).

When the elapsed time t is sufficiently longer than the time constants $\tau_1$ and $\tau_2$ represented by Equations (10) and (11), that is, when the temperature $T_h$ of the heater HT at which the temperature $T_W$ of the wafer W reaches the target temperature after transition from the transient state in the period T2 of FIGS. 6A and 6B to the steady state in the period T3, Equation (12) may be omitted as in Equation (13) as follows.

$$T_w = T_h + q_p \cdot (R_{th} \cdot A + R_{thc} \cdot A) \quad (13)$$

For example, the temperature $T_W$ of the wafer W may be obtained based on the heater temperature $T_h$, the heat flux $q_p$, and the thermal resistances $R_{th} \cdot A$ and $R_{thc} \cdot A$ using Equation (13).

Return to FIG. 3. The heater control unit 102a controls the temperature of each heater HT. For example, the heater control unit 102a controls the temperature of each heater HT by outputting control data indicating supply power supplied to each heater HT to the heater power supply HP and controlling the supply power supplied from the heater power supply HP to each heater HT.

At the time of plasma processing, the target set temperature of each heater HT is set in the heater control unit 102a. For example, in the heater control unit 102a, the target temperature of the wafer W is set for each divided region of the placement region 18a as the set temperature of the heater HT of each divided region. The target temperature of the wafer W is, for example, a temperature at which the accuracy of plasma etching on the wafer W is the best.

At the time of plasma processing, the heater control unit 102a controls the supply power supplied to each heater HT such that each heater HT has the set temperature. For example, the heater control unit 102a compares, for each divided region, the temperature of each divided region of the placement region 18a indicated by the temperature data input to the external interface 101 with the set temperature of the divided region, and specifies each of divided regions having a temperature lower than the set temperature and divided regions having a high temperature lower than the set temperature. The heater control unit 102a outputs control data to the heater power supply HP so as to increase the supply power with respect to the divided regions having a temperature lower than the set temperature and to decrease the supply power with respect to the divided regions having a temperature higher than the set temperature.

The measurement unit 102b measures the supply power supplied to each heater HT using the supply power supplied to each heater HT indicated by the power data input to the external interface 101. For example, the measurement unit 102b measures the supply power supplied to each heater HT in the non-ignited state in which the plasma is not ignited by controlling the supply power supplied to each heater HT by the heater control unit 102a such that the temperature of each heater HT becomes constant, and in the transient state until the fluctuation of the decrease tendency of the supply power supplied to each heater HT after igniting the plasma is stabilized.

At the time of plasma processing, the heater control unit 102a controls the supply power supplied to each heater HT such that each heater HT has a constant set temperature. The measurement unit 102b measures the supply power suppled to each heater HT in the non-ignited state in which the plasma before the start of plasma processing is not ignited in the state in which the heater control unit 102a controls the supply power supplied to each heater HT such that the temperature of each heater HT reaches a constant set temperature. In addition, the measurement unit 102b measures the supply power supplied to each heater HT in the transient state until fluctuation of the decrease tendency of the supply power supplied to each heater HT after igniting the plasma is stabilized. The supply power supplied to each heater HT in the non-ignited state may be measured at least once at each heater HT, and an average value obtained by measuring the supply power multiple times may be determined as the supply power supplied in the non-ignited state. The supply power supplied to each heater HT in the transient state may be measured twice or more. A measurement timing for measuring the supply power may be a timing at which the decrease tendency of the supply power is large. In addition, when the number of measurements is small, the measurement timings may be separated from each other by a predetermined period or more. In the present embodiment, the measurement unit 102b measures the supply power supplied to each heater HT in a predetermined cycle (e.g., in a cycle of 0.1 seconds) during the plasma processing period. As a result, the supply power supplied to each heater HT in the transient state is measured multiple times.

The measurement unit 102b measures the supply power supplied to each heater HT in the non-ignited state and the transient state in a predetermined cycle. For example, the measurement unit 102b measures the supply power supplied to each heater HT in the non-ignited state and transient state each time when a wafer W is exchanged and the exchanged wafer W is placed on the placement table 16 so as to perform a plasma processing. In addition, for example, the parameter calculation unit 102c may measure the supply power supplied to each heater HT in the non-ignited state and transient state in each plasma processing.

The parameter calculation unit 102c calculates, for each heater HT, the heat input amount and the thermal resistance by performing fitting on a calculation model for calculating the supply power in the transient state using the heat input amount from the plasma and the thermal resistance between the wafer W and the heater HT as parameters, using the supply power measured by the measurement unit 102b in the non-ignited state and transient state.

For example, the parameter calculation unit 102c obtains the heater power in the non-ignited state, $P_{h0}$, for each elapsed time t for each heater HT. Further, the parameter calculation unit 102c obtains the heater power in the transient state, $P_h$, for each elapsed time t for each heater HT. Then, the parameter calculation unit 102c divides each of the obtained heater power $P_h$ and the heater power $P_{h0}$ by the area of each heater HT, thereby obtaining a heat generation amount per unit area from the heater HT in the non-ignited state, $q_{h0}$, for each elapsed time t and a heat generation amount per unit area from the heater HT in the transient state, $q_h$, for each elapsed time t.

Then, the parameter calculation unit 102c calculates the heat flux $q_p$ and the thermal resistance $R_{th} \cdot A$ that minimize an error by performing, for each heater HT, fitting on the heat generation amount per unit area from the heater HT, $q_h$, for each elapsed time t and the heat generation amount per unit area from the heater HT, $q_{h0}$, using Equations (1) to (11) described above as calculation models.

The parameter calculation unit 102c calculates the heat flux $q_p$ and the thermal resistance $R_{th} \cdot A$ in a predetermined cycle using measured supply power in the non-ignited state and the transient state. For example, each time when the wafer W is exchanged, the parameter calculation unit 102c calculates the heat flux $q_p$ and the thermal resistance $R_{th} \cdot A$ using measured supply power in the non-ignited state and the transient state. For example, the parameter calculation unit 102c may calculate the heat flux $q_p$ and the thermal resistance $R_{th} \cdot A$ using the supply power in the non-ignited state and the transient state for each plasma processing.

The set temperature calculation unit 102d calculates, for each heater HT, the set temperature of the heater HT at which the wafer W reaches the target temperature using the calculated heat input amount and thermal resistance. For example, for each heater HT, the set temperature calculation unit 102d substitutes the calculated heat flux $q_p$ and the thermal resistance $R_{th} \cdot A$ into Equations (5), (6), and (12), and calculates the temperature $T_h$ of the heater HT at which the temperature $T_W$ of the wafer W reaches the target temperature from Equation (12) using $a_1$, $a_2$, $a_3$, $\lambda_1$, $\lambda_2$, $\tau_1$, and $\tau_2$ represented by Equations (5) to (11). For example, the set temperature calculation unit 102d calculates the temperature $T_h$ of the heater HT, at which the temperature $T_W$ of the wafer W reaches the target temperature, as a predetermined value which is large enough to regard the elapsed time t as a steady state. The calculated temperature $T_h$ of the heater HT is the temperature of the heater HT at which the temperature of the wafer W reaches the target temperature. The temperature $T_h$ of the heater HT at which the temperature of the wafer W reaches the target temperature may be obtained from Equation (13).

The set temperature calculation unit 102d may calculate the temperature $T_W$ of the wafer W at the current temperature $T_h$ of the heater HT from Equation (12). For example, the set temperature calculation unit 102d calculates the temperature $T_W$ of the wafer W in the case where the elapsed time t is set to a predetermined value which is large enough to regard the elapsed time t as a steady state at the current temperature $T_h$ of the heater HT. Next, the set temperature calculation unit 102d calculates a difference $\Delta T_W$ between the calculated temperature $T_W$ and the target temperature. The set temperature calculation unit 102d may calculate the temperature calculated by subtracting the difference $\Delta T_W$ from the current temperature $T_h$ of the heater HT as the temperature of the heater HT at which the temperature of the wafer W reaches the target temperature.

The set temperature calculation unit 102d corrects the set temperature of each heater HT of the heater control unit 102a to the temperature of the heater HT at which the temperature of the wafer W reaches the target temperature.

The set temperature calculation unit 102d corrects the set temperature of each heater HT by calculating the temperature of the heater HT at which the temperature of the wafer W reaches the target temperature, in a predetermined cycle. For example, each time when the wafer W is exchanged, the set temperature calculation unit 102d calculates the temperature of the heater HT at which the temperature of the wafer W reaches the target temperature, and corrects the set temperature of each heater HT. For example, the set temperature calculation unit 102d may correct the set temperature of each heater HT by calculating the temperature of the heater HT at which the temperature of the wafer W reaches the target temperature, for each plasma processing.

Thus, the plasma processing apparatus 10 according to the present embodiment is capable of accurately controlling the temperature of the wafer W during the plasma processing to the target temperature.

Meanwhile, respective plasma processing apparatuses 10 may be different from each other in the characteristics of processing containers 12 thereof in some cases. Therefore, in some cases, the plasma processing apparatus 10 may not be capable of accurately controlling the temperature of the wafer W during the plasma processing to the target temperature even if the set temperature of each heater HT at which the wafer W reaches the target temperature is used in another plasma processing apparatus 10.

Therefore, the plasma processing apparatus 10 according to the present embodiment calculates the heat flux $q_p$ and the thermal resistance $R_{th} \cdot A$ according to the characteristics in its own processing container 12. Thus, the plasma processing apparatus 10 according to the present embodiment is capable of accurately controlling the temperature of the wafer W during the plasma processing to the target temperature even when respective plasma processing apparatuses 10 are different from each other in the characteristics of processing containers 12 thereof.

Further, in the plasma processing apparatus 10, the thermal characteristics of the placement table 16 may change over time due to, for example, consumption of the electrostatic chuck 18.

Thus, the plasma processing apparatus 10 according to the present embodiment corrects the set temperature of each heater HT by calculating the temperature of the heater HT at which the temperature of the wafer W reaches the target temperature, in a predetermined cycle. Thus, the plasma processing apparatus 10 according to the present embodiment is capable of accurately controlling the temperature of the wafer W during the plasma processing to the target temperature even when the thermal characteristics of the placement table 16 thereof change over time.

Further, in the plasma processing apparatus 10, due to, for example, significant consumption of the electrostatic chuck 18 and adhesion of deposits, the characteristics in the processing container 12 are changed, resulting in an abnormal state that is not suitable for the plasma processing. In addition, an abnormal wafers W may be carried into the plasma processing apparatus 10 in some cases.

Therefore, the alert unit 102e performs an alert based on the change of at least one of the heat input amount and the thermal resistance calculated in a predetermined cycle by the parameter calculation unit 102c. For example, the alert unit 102e compares the heat flux $q_p$ and the thermal resistance $R_{th} \cdot A$ calculated by the parameter calculation unit 102c in a predetermined cycle for each heater HT, and performs an alert when at least one of the heat flux $q_p$ and the thermal resistance $R_{th} \cdot A$ is changed by a predetermined allowable value or higher. In addition, when at least one of the heat flux $q_p$ and the thermal resistance $R_{th} \cdot A$ calculated by the parameter calculation unit 102c in a predetermined cycle is out of a predetermined allowable range, the alert unit 102e performs an alert. Any method may be used as long as it can notify, for example, a process manager of an alarm. For example, the alert unit 102e displays a message notifying an abnormality on the user interface 103.

Thus, the plasma processing apparatus 10 according to the present embodiment is capable of notifying the occurrence of an abnormality when a characteristic in the processing container 12 becomes abnormal, or when an abnormal wafer W is carried into the processing container 12.

[Flow of Temperature Control]

Figure 8:
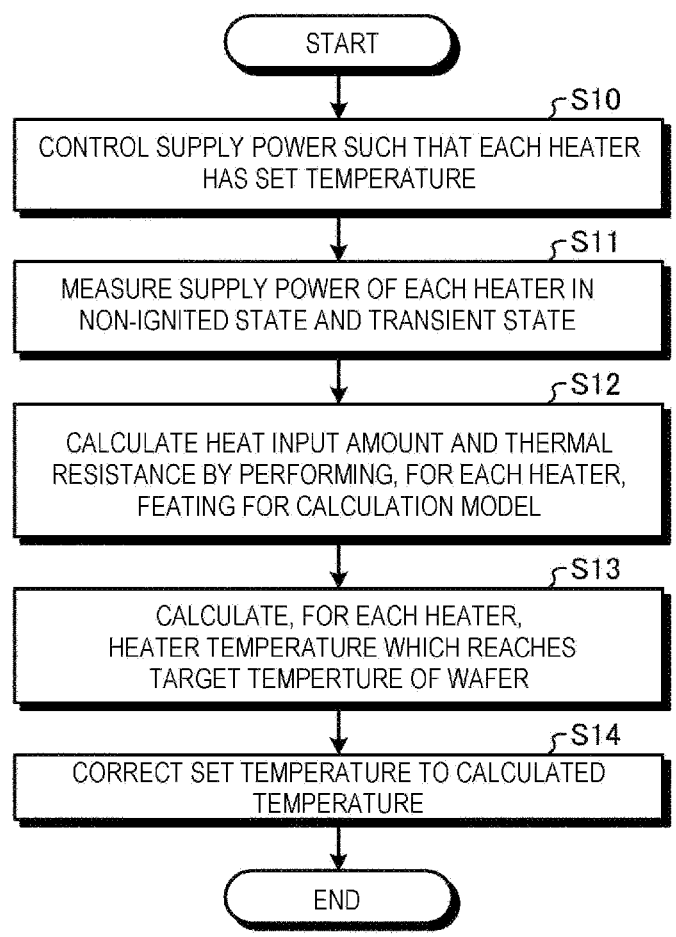
FIG. 8 is a flowchart illustrating an example of a flow of a temperature control method according to the first embodiment.

Next, a temperature control method using the plasma processing apparatus 10 according to the present embodiment will be described. FIG. 8 is a flowchart illustrating an example of a flow of a temperature control method according to the first embodiment. This temperature control method is executed at a predetermined timing, for example, at the timing of starting a plasma processing.

The heater control unit 102a controls the supply power supplied to each heater HT such that each heater HT has the set temperature (step S10).

In the state in which the heater control unit 102a controls the supply power supplied to each heater HT such that the temperature of each heater HT reaches a constant set temperature, the measurement unit 102b measures the supply power suppled to each heater HT in the non-ignited state and the transient state (step S11).

The parameter calculation unit 102c calculates the heat input amount and the thermal resistance by performing, for each heater HT, fitting on a calculation model using a heat generation amount per unit area from the heater HT, which is obtained by dividing measured supply power in the non-ignited state and the transient state by the area of the heater HT (step S12). For example, the parameter calculation unit 102c calculate the heat flux $q_p$ and the thermal resistance $R_{th} \cdot A$ that minimize an error by performing, for each heater HT, fitting on the heat generation amount per unit area $q_h$ from the heater HT for each elapsed time t and the heat generation amount per unit area cm from the heater HT using Equations (1) to (11) described above as calculation models.

The set temperature calculation unit 102d calculates, for each heater HT, the temperature of the heater HT at which the wafer W reaches the target temperature using the calculated heat input amount and thermal resistance (step S13). For example, for each heater HT, the set temperature calculation unit 102d substitutes the calculated heat flux $q_p$ and the thermal resistance $R_{th} \cdot A$ into Equations (5), (6), and (12), and calculates the temperature $T_h$ of the heater HT at which the temperature $T_W$ of the wafer W reaches the target temperature from Equation (12) using $a_1$, $a_2$, $a_3$, $\lambda_1$, $\lambda_2$, $\tau_1$, and $\tau_2$ represented by Equations (5) to (11). The temperature $T_h$ of the heater HT at which the temperature of the wafer W reaches the target temperature may be obtained from Equation (13).

The set temperature calculation unit 102d corrects the set temperature of each heater HT of the heater control unit 102a to the temperature of the heater HT at which the temperature of the wafer W reaches the target temperature (step S14), and terminates the processing. That is, when the temperature of the heater HT at which the temperature of the wafer W reaches the target temperature deviates from the set temperature of each heater HT at the process of controlling the supply power supplied to each heater HT (step S10), the heater control unit 102a controls the supply power supplied to each heater HT again such that the temperature of the wafer W reaches the temperature of the heater HT which reaches the target temperature. Further, when there is no deviation, the set temperature is controlled as it is.

As described above, the plasma processing apparatus 10 according to the present embodiment includes a placement table 16, a heater control unit 102a, a measurement unit 102b, a parameter calculation unit 102c, and a set temperature calculation unit 102d. The placement table 16 is provided with a heater HT capable of adjusting the temperature of a placement surface on which the wafer W is placed. The heater control unit 102a controls the supply power supplied to the heater HT such that the heater HT has the set temperature. The measurement unit 102b measures the supply power in the non-ignited state in which the plasma is not ignited by controlling the supply power supplied to the heater HT by the heater control unit 102a such that the temperature of the heater HT becomes constant, and in the transient state in which the supply power supplied to the heater HT decreases after igniting the plasma. The parameter calculation unit 102c calculates the heat input amount and the thermal resistance by performing fitting on a calculation model for calculating the supply power of the transient state using the heat input amount from the plasma and the thermal resistance between the wafer W and the heater HT as parameters, using the supply power measured by the measurement unit 102b in the non-ignited state and the transient state. The set temperature calculation unit 102d calculates the set temperature of the heater HT at which the wafer W reaches the target temperature, using the heat input amount and thermal resistance calculated by the parameter calculation unit 102c. Thus, the plasma processing apparatus 10 is capable of accurately controlling the temperature of the wafer W during the plasma processing to the target temperature.

In addition, in the plasma processing apparatus 10 according to the present embodiment, a heater HT is individually provided for each of divided regions of the placement surface of the placement table 16 is divided. The heater control unit 102a controls the supply power for each heater HT such that the heater HT provided in each region has a set temperature set for each region. In the state where the supply power is controlled by the heater control unit 102a such that the temperature becomes constant for each heater HT, the measurement unit 102b measures the supply power in the non-ignited state and the transient state. For each heater HT, the parameter calculation unit 102c performs fitting on a calculation model using the supply power in the non-ignited state and the transient state, which is measured by the measurement unit 102b, and calculates a heat input amount and a thermal resistance for each heater HT. The set temperature calculation unit 102d calculates, for each heater HT, a set temperature at which the wafer W reaches the target temperature, using the heat input amount and thermal resistance calculated by the parameter calculation unit 102c. Thus, even when the heater HT is individually provided for each of divided regions of the placement surface so as to control the temperature of the wafer W, the plasma processing apparatus 10 is capable of accurately controlling the temperature of the wafer W during the plasma processing for each region to the target temperature.

The process of correcting the set temperature of each heater HT to the temperature of the heater HT at which the temperature of the wafer W reaches the target temperature (step S14) may be performed continuously from the process of measuring the supply power supplied to each heater in the ignited state in which the plasma is ignited (a part of step S11) while leaving the ignited state in which the plasma is ignited. Thus, the process is executed at a constant temperature for each wafer W to be processed.

Alternatively, the set temperature of the heater HT at which the calculated temperature of the wafer W reaches the target temperature may be used as the set temperature for each heater HT in the process of controlling the supply power to each heater HT (step S10) at the timing when the plasma processing is completed and the wafer W is replaced. That is, the process of correcting the set temperature of each heater HT to the temperature of the heater HT at which the temperature of the wafer W reaches the target temperature (step S14) coincides with the process of controlling the supply power to each heater HT in the processing for the next wafer W that has been replaced (step S10). Thus, the deviation between the temperature of the heater HT at which the temperature of the wafer W reaches the target temperature and the set temperature of each heater HT in the process of controlling the supply power to each heater HT (step S10) can be made as small as possible.

In addition, in the plasma processing apparatus 10 according to the present embodiment, the measurement unit 102b measures the supply power in the non-ignited state and the transient state in a predetermined cycle. The parameter calculation unit 102c calculates each a heat input amount and a thermal resistance using the supply power in the measured non-ignited state and the transient state, which is measured in every predetermined cycle. The alert unit 102e performs an alert based on the change of at least one of the heat input amount and the thermal resistance calculated by the parameter calculation unit 102c. Thus, the plasma processing apparatus 10 is capable of notifying the occurrence of an abnormality when a characteristic in the processing container 12 becomes abnormal, or when an abnormal wafer W is carried into the processing container 12.

Second Embodiment

Next, a second embodiment will be described. Since the configurations of the plasma processing apparatus 10 and the placement table 16 according to the second embodiment are the same as those of the plasma processing apparatus 10 and the placement table 16 according to the first embodiment illustrated in FIGS. 1 and 2, descriptions thereof will be omitted.

Figure 9:
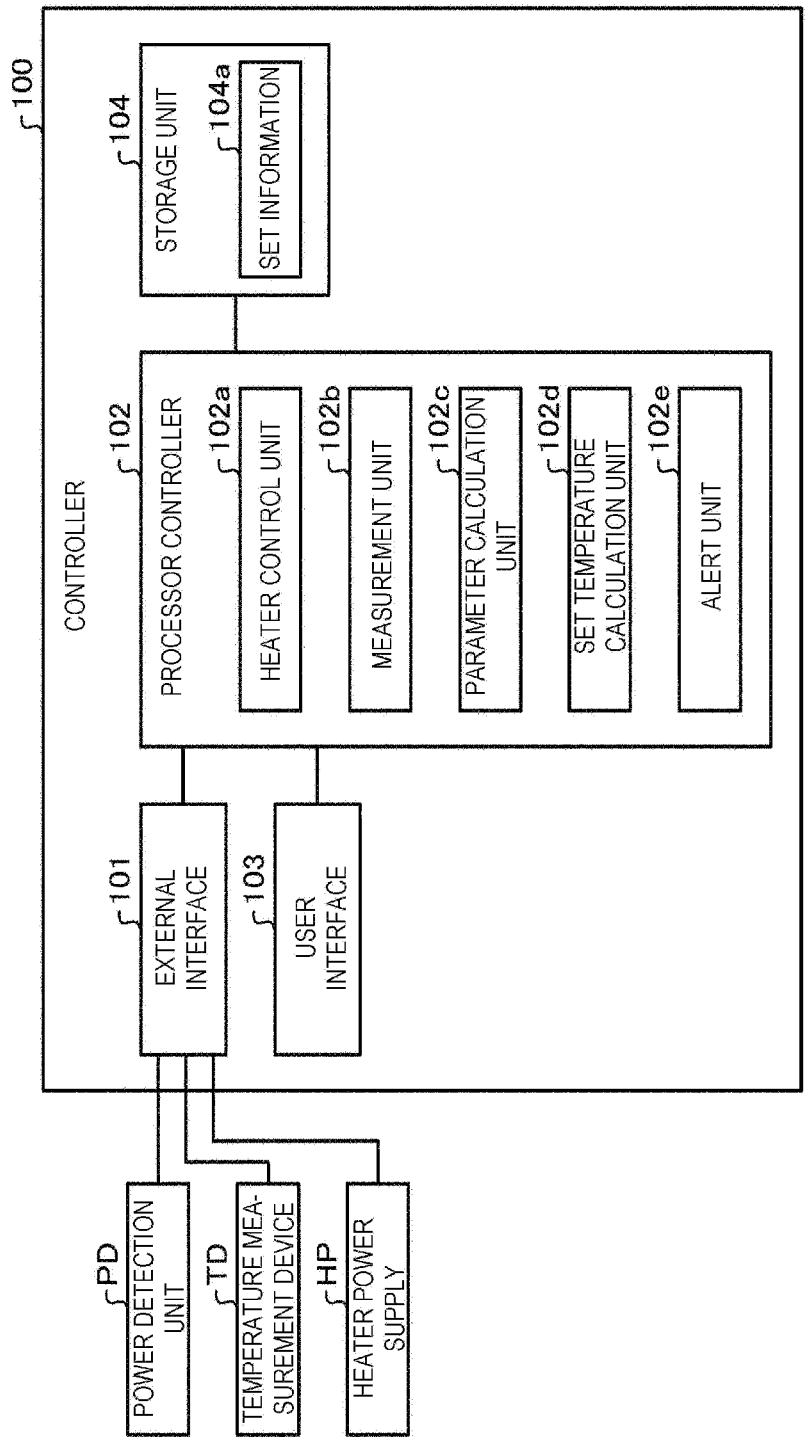
FIG. 9 is a block diagram illustrating a schematic configuration of a controller that controls a plasma processing apparatus according to a second embodiment.

FIG. 9 is a block diagram illustrating a schematic configuration of a controller that controls the plasma processing apparatus according to the second embodiment. Since the configuration of the controller 100 according to the second embodiment is partly the same as the configuration of the controller 100 according to the first embodiment illustrated in FIG. 3, the same components are denoted by the same reference numerals and different points will be mainly described.

Figure 10:
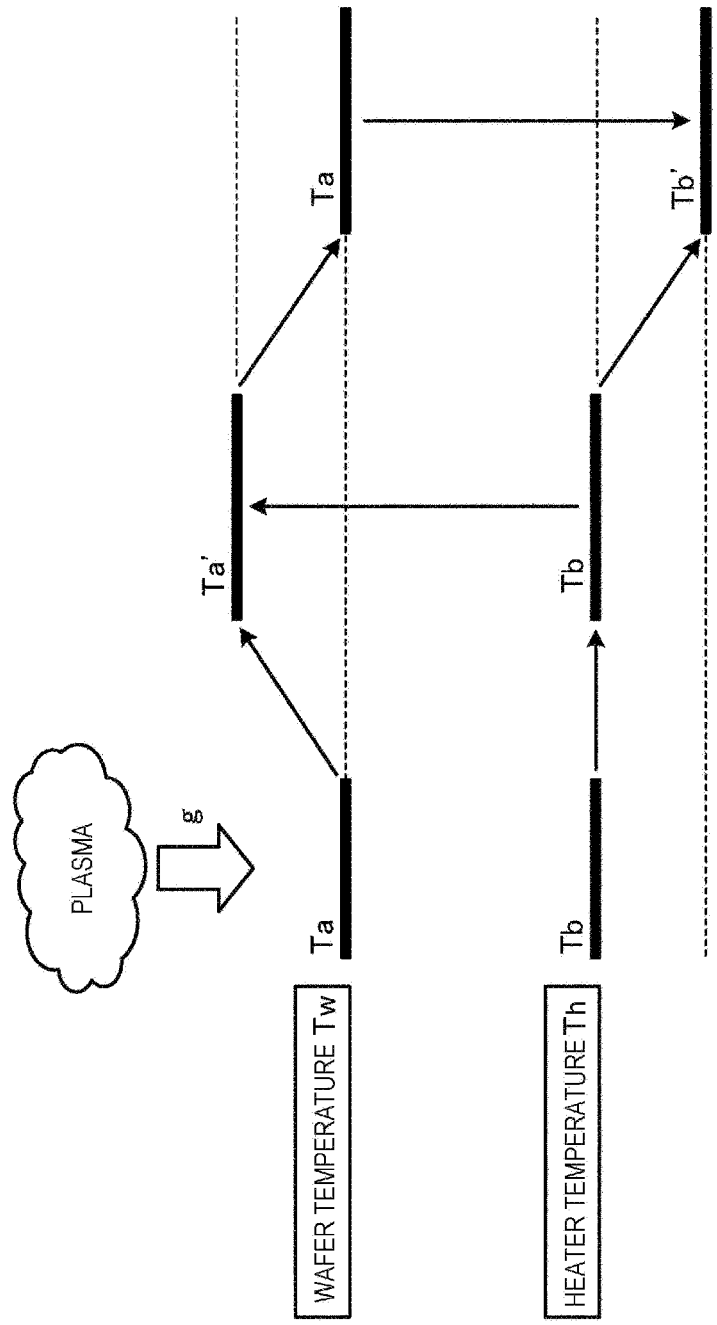
FIG. 10 is a view schematically representing a temperature change of a wafer.

When the heater control unit 102a controls the supply power supplied to each heater HT such that the temperature of each heater HT becomes constant and the supply power in a non-ignited state and a transient state is measured, the temperature $T_W$ of the wafer W is rises due to heat input from plasma in the transient state rather than the non-ignited state. FIG. 10 is a view schematically representing a temperature change of a wafer. For example, the heater control unit 102a controls the temperature $T_h$ of the heater HT to a predetermined set temperature Tb at which the temperature $T_W$ of the wafer W reaches a predetermined target temperature Ta in the non-ignited state. When the plasma is ignited in this state, the temperature of the wafer W rises to a temperature Ta' due to the heat input from the plasma. When the temperature of the wafer W rises to the temperature Ta' in this way, the heater control unit 102a lowers the temperature $T_h$ of the heater HT to a temperature Tb' such that the temperature of the wafer W reaches the target temperature Ta. In this way, when the temperature of the wafer W is raised to the temperature Ta' and then controlled to the target temperature Ta, the plasma processing apparatus 10 takes time until the temperature $T_W$ of the wafer W reaches the target temperature Ta.

Therefore, the controller 100 according to the second embodiment stores the initial values of the heat flux $q_p$ and the thermal resistance $R_{th}·A$ in the storage unit 104 as set information 104a. For example, a process manager or a manager inputs the initial values of the heat flux $q_p$ and the thermal resistance $R_{th}·A$ obtained by past experiences, tests, etc. from the user interface 103. The controller 100 stores the initial values of the heat flux $q_p$ and the thermal resistance $R_{th}·A$ input from the user interface 103, in the storage unit 104 as set information 104a.

When the plasma processing is started, the set temperature calculation unit 102d reads the initial values of the heat flux $q_p$ and the thermal resistance $R_{th}·A$ from the set information 104a. The set temperature calculation unit 102d calculates the set temperature of each heater HT to be the target temperature of the wafer from the read heat flux $q_p$ and thermal resistance $R_{th} \cdot A$ using Equation (12) or Equation (13). The heater control unit 102a controls the supply power supplied to each heater HT such that the temperature of each heater HT calculated by the set temperature calculation unit 102d becomes a set temperature. By storing the initial values of the appropriate heat flux $q_p$ and thermal resistance $R_{th} \cdot A$ in the storage unit 104 as the set information 104a, the set temperature calculation unit 102d is capable of calculating the set temperature of the heater HT such that the temperature of the wafer W reaches the target temperature even there is heat input from the plasma even in the first wafer W. For example, in the case of FIG. 10, the set temperature calculation unit 102d is capable of calculating the temperature Tb' of the heater HT such that the temperature of the wafer W also reaches the target temperature Ta even in the first wafer W. Thus, the plasma processing apparatus 10 is capable of shortening the time until the temperature $T_W$ of the first wafer W reaches the target temperature Ta.

In the state in which the supply power to each heater HT by the parameter calculation unit 102c such that each heater HT has the set temperature, the measurement unit 102b measures the supply power supplied to each heater HT in the non-ignited state and the transient state.

The parameter calculation unit 102c calculates, for each heater HT, the heat input amount and the thermal resistance in an actual plasma processing by performing fitting on a calculation model for calculating the supply power of the transient state using the heat input amount from the plasma and the thermal resistance between the wafer W and the heater HT as parameters, using the supply power measured by the measurement unit 102b in the non-ignited state and transient state.

For example, the parameter calculation unit 102c obtains the heater power $P_{h0}$ in the non-ignited state for each elapsed time t for each heater HT. Further, the parameter calculation unit 102c obtains the heater power $P_h$ in the transient state for each elapsed time t for each heater HT. Then, the parameter calculation unit 102c divides each of the obtained heater power $P_h$ and the heater power $P_{h0}$ by the area of each heater HT, thereby obtaining a heat generation amount per unit area $q_{h0}$ from the heater HT in the non-ignited state for each elapsed time t and a heat generation amount $q_h$ per unit area from the heater HT in the transient state for each elapsed time t.

Then, the parameter calculation unit 102c calculates the heat flux $q_p$ and the thermal resistance $R_{th} \cdot A$ that minimize an error in an actual plasma processing by performing, for each heater HT, fitting on the heat generation amount per unit area $q_h$ from the heater HT for each elapsed time t and the heat generation amount per unit area $q_{h0}$ from the heater HT using Equations (1) to (11) described above as calculation models.

The set temperature calculation unit 102d calculates, for each heater HT, the set temperature of the heater HT at which the wafer W reaches the target temperature using the heat flux $q_p$ and the thermal resistance $R_{th} \cdot A$ of the actual plasma processing calculated by the parameter calculation unit 102c.

The set temperature calculation unit 102d determines whether the set temperature of each heater HT calculated from the heat flux $q_p$ and the thermal resistance $R_{th} \cdot A$ of the actual plasma process calculated from the initial values of the heat flux $q_p$ and the thermal resistance $R_{th} \cdot A$ is deviated from the set temperature of each heater HT calculated from the initial values of the heat flux $q_p$ and the thermal resistance $R_{th} \cdot A$ by a predetermined value or more. When it is determined that the deviation exceeds the predetermined value, the set temperature calculation unit 102d updates the set temperature of the heater control unit 102a to the set temperature of each heater HT calculated from the heat flux $q_p$ and the thermal resistance $R_{th} \cdot A$ of the actual plasma processing. Thus, since the set temperature of each heater HT is updated to the set temperature obtained from the heat flux $q_p$ and the thermal resistance $R_{th} \cdot A$ of the actual plasma process, it is possible to accurately control the temperature of the wafer W to the target temperature. The heater control unit 102a controls the supply power supplied to each heater HT such that each heater HT has the updated set temperature.

When it is determined that the deviation exceeds the predetermined amount, the set temperature calculation unit 102d stores the heat flux $q_p$ and the thermal resistance $R_{th} \cdot A$ of the actual plasma processing in the set information 104a. For example, the set temperature calculation unit 102d replaces the initial values of the heat flux $q_p$ and the thermal resistance $R_{th} \cdot A$ stored in the setting information 104a with the heat flux $q_p$ and the thermal resistance $R_{th} \cdot A$ of the actual plasma processing. As a result, the heat flux $q_p$ and the thermal resistance $R_{th} \cdot A$ of the actual plasma processing are stored in the set information 104a as initial values to be used. That is, when it is determined that the deviation exceeds the predetermined amount, the set temperature calculation unit 102d always updates the heat flux $q_p$ and the thermal resistance $R_{th} \cdot A$ stored in the storage unit 104 to the latest values.

[Flow of Temperature Control]

Figure 11:
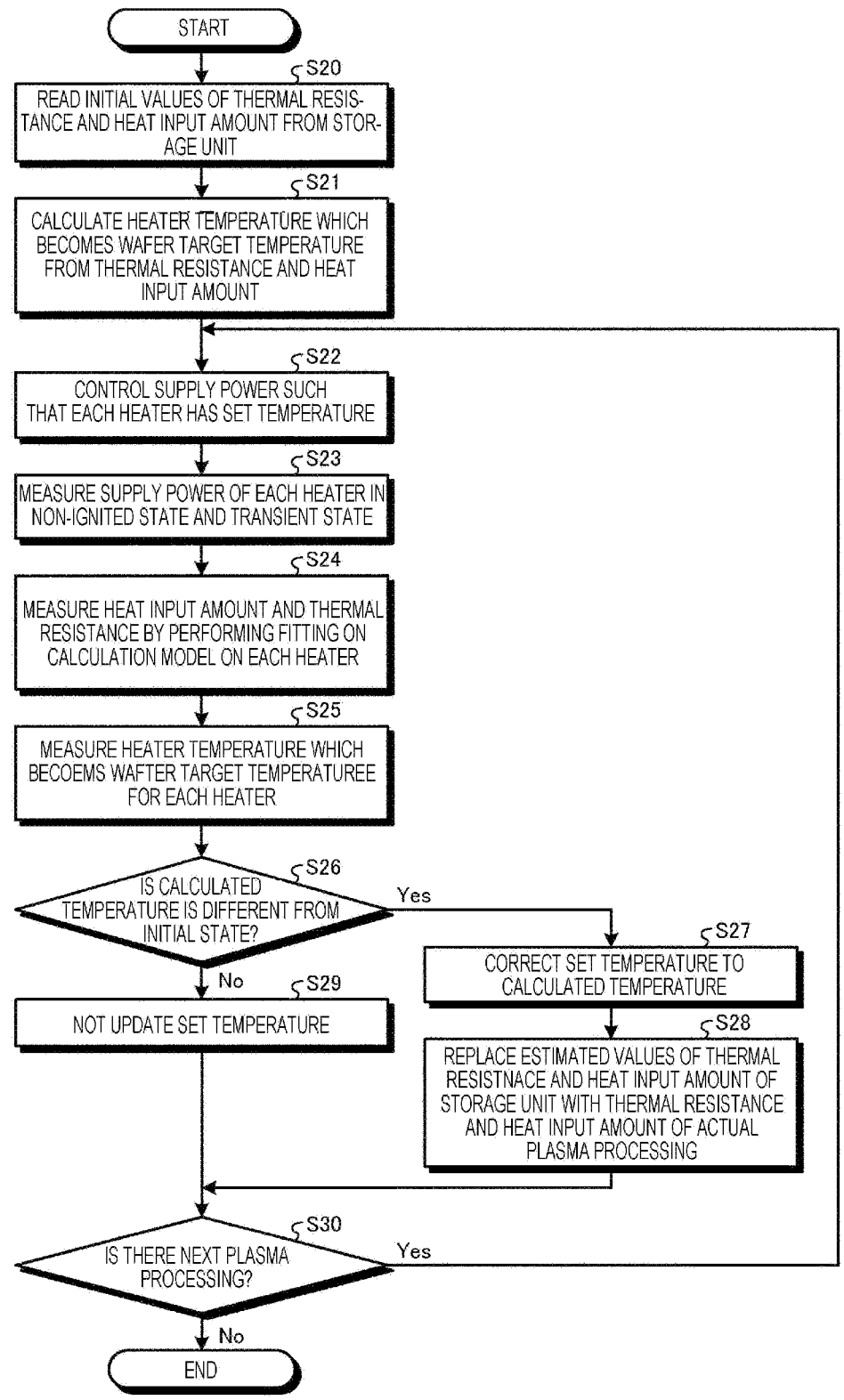
FIG. 11 is a flowchart illustrating an example of a flow of a temperature control method according to the second embodiment.

Next, a temperature control method using the plasma processing apparatus 10 according to the second embodiment will be described. FIG. 11 is a flowchart illustrating an example of a flow of a temperature control method according to the second embodiment.

When the plasma processing is started, the set temperature calculation unit 102d reads the initial values of the heat flux $q_p$ and the thermal resistance $R_{th} \cdot A$ from the set information 104a (step S20).

The set temperature calculation unit 102d calculates the set temperature of each heater HT to be the target temperature of the wafer W from the heat flux $q_p$ and the thermal resistance $R_{th} \cdot A$ using Equation (12) or Equation (13) (step S21).

The heater control unit 102a controls the supply power supplied to each heater HT such that each heater HT has the set temperature (step S22).

In the state in which the heater control unit 102a controls the supply power supplied to each heater HT such that the temperature of each heater HT reaches a constant set temperature, the measurement unit 102b measures the supply power supplied to each heater HT in the non-ignited state and the transient state (step S23).

The parameter calculation unit 102c calculates the heat input amount and the thermal resistance by performing, for each heater HT, fitting on a calculation model using a heat generation amount per unit area from the heater HT, which is obtained by dividing measured supply power in the non-ignited state and the transient state by the area of the heater HT (step S24). For example, the parameter calculation unit 102c calculate the heat flux $q_p$ and the thermal resistance $R_{th} \cdot A$ that minimize an error by performing, for each heater HT, fitting on the heat generation amount per unit area $q_h$ from the heater HT for each elapsed time t and the heat generation amount per unit area $q_{h0}$ from the heater HT using Equations (1) to (11) described above as calculation models.

The set temperature calculation unit 102d calculates, for each heater HT, the temperature of the heater HT at which the wafer W reaches the target temperature using the calculated heat input amount and thermal resistance (step S25). For example, for each heater HT, the set temperature calculation unit 102d substitutes the calculated heat flux $q_p$ and the thermal resistance $R_{th} \cdot A$ into Equations (5), (6), and (12), and calculates the temperature $T_h$ of the heater HT at which the temperature $T_W$ of the wafer W reaches the target temperature from Equation (12) using $a_1$, $a_2$, $a_3$, $\lambda_1$, $\lambda_2$, $\tau_1$, and $\tau_2$ represented by Equations (5) to (11). At this time, the temperature $T_h$ of the heater HT at which the temperature of the wafer W reaches the target temperature may be obtained from Equation (13).

The set temperature calculation unit 102d determines whether the set temperature of each heater HT calculated from the heat flux $q_p$ and the thermal resistance $R_{th} \cdot A$ of the actual plasma process calculated from the initial values of the heat flux $q_p$ and the thermal resistance $R_{th} \cdot A$ is deviated from the set temperature of each heater HT calculated from the initial values of the heat flux $q_p$ and the thermal resistance $R_{th} \cdot A$ by a predetermined value or more (step S26).

When it is determined that the deviation exceeds the predetermined value (step S26: Yes), the set temperature calculation unit 102d updates the set temperature of the heater control unit 102a to the set temperature of each heater HT calculated from the heat flux $q_p$ and the thermal resistance $R_{th} \cdot A$ of the actual plasma processing (step S27).

For example, the set temperature calculation unit 102d replaces the initial values of the heat flux $q_p$ and the thermal resistance $R_{th} \cdot A$ stored in the setting information 104a with the heat flux $q_p$ and the thermal resistance $R_{th} \cdot A$ of the actual plasma processing (step S28). As a result, the heat flux $q_p$ and the thermal resistance $R_{th} \cdot A$ of the actual plasma processing are stored in the set information 104a as initial values to be used.

On the other hand, when it is determined that the deviation does not exceed the predetermined value (step S26: No), the set temperature calculation unit 102d does not update the set temperature and controls it as it is (step S29).

The set temperature calculation unit 102d determines whether or not there is a next plasma processing to be carried out continuously (step S30). When it is determined that there is a next plasma processing to be carried out continuously (step S30: Yes), the process proceeds to the above-described step S22. On the other hand, when it is determined that there is no next plasma processing to be carried out continuously (step S30: No), the process is terminated.

As described above, the plasma processing apparatus 10 according to the present embodiment stores the heat input amount and the thermal resistance in the storage unit 104 as set information 104a. The set temperature calculation unit 102d calculates the set temperature of the heater HT at which the wafer W reaches the target temperature, using the heat input amount and thermal resistance stored in the storage unit 104. Thus, the plasma processing apparatus 10 is capable of shortening the time until the temperature $T_W$ of the wafer W reaches the target temperature Ta. In addition, since the plasma processing apparatus 10 sets the temperature of the heater HT which is predicted to be the target temperature of the wafer W, the error of the temperature of the wafer W after plasma ignition becomes small, and the temperature of the wafer W during the plasma processing is capable of being accurately controlled to the target temperature.

The set temperature calculation unit 102d determines whether or not the calculated set temperature is deviated from the set temperature calculated from the heat input amount and the thermal resistance calculated by the parameter calculation unit 102c by a predetermined amount or more. When it is determined that the deviation exceeds the predetermined value, the set temperature calculation unit 102d updates the heat input amount and the thermal resistance stored in the storage unit 104 to the heat input amount and the thermal resistance calculated by the parameter calculation unit 102c. Thus, it is possible to control the temperature of the wafer W to the target temperature more accurately even in the plasma proceeding to be performed subsequently.

For example, in the above-described embodiments, a case where the plasma processing is performed on a semiconductor wafer as a workpiece has been described as an example, but the present disclosure is not limited thereto. The workpiece may be any one as long as it influences the progress of the plasma processing depending on the temperature.

In the second embodiment, a case where one initial value of the heat flux $q_p$ and the thermal resistance $R_{th} \cdot A$ is stored in the setting information 104a has been described as an example, but the present disclosure is not limited thereto. Since the heat flux $q_p$ and the thermal resistance $R_{th} \cdot A$ depend on the conditions under which the plasma processing is performed, when using different plasma processing conditions, it is also required to switch estimated heat flux $q_p$ and thermal resistance $R_{th} \cdot A$. Therefore, the heat flux $q_p$ and the thermal resistance $R_{th} \cdot A$ are stored in the storage unit 104 in association with parameters of the plasma processing which are dependent thereon. For example, parameters of the plasma processing which are dependent on the thermal resistance $R_{th}$ include, for example, a heat transfer gas pressure, a voltage applied to the electrostatic chuck 18, a coolant temperature, and a surface state of the electrostatic chuck 18. The plasma processing parameters which are dependent on the heat flux $q_p$ include, for example, high-frequency power HFS, high-frequency power LFS, the pressure inside the processing chamber 12, and a gas type. The set temperature calculation unit 102d may read the heat flux $q_p$ and the thermal resistance $R_{th} \cdot A$ corresponding to the plasma processing conditions of the plasma processing to be performed, from the storage unit 104.

In addition, in the above-described embodiments, a case where a plasma etching is performed as the plasma processing has been described as an example, but the present disclosure is not limited thereto. The plasma processing may be any processing as long as it uses plasma and the progress of the processing is affected by a temperature.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A plasma processing apparatus comprising:
a placement table including a placement surface on which a workpiece serving as a plasma processing target is placed and a heater configured to adjust a temperature of the placement surface;
a heater controller configured to supply power to the heater such that the heater reaches a set temperature;
a power monitor configured to measure the power supplied to the heater in a non-ignited state where plasma is not ignited and in an ignited state where the plasma is ignited, while the power supplied to the heater is controlled by the heater controller such that a temperature of the heater becomes a constant temperature;
a parameter calculator configured to calculate a heat input amount from the plasma and a thermal resistance between the workpiece and the heater by using the power measured by the power monitor in the non-ignited state and in the ignited state; and
a set temperature calculator configured to calculate the set temperature of the heater at which the workpiece reaches a target temperature, by using the heat input amount and the thermal resistance calculated by the parameter calculator.

2. The plasma processing apparatus according to claim 1, wherein the heater comprises a plurality of heaters, and each one of the plurality of heaters is individually provided for each of divided regions of the placement surface of the placement table, and
the heater controller controls the power supplied for each heater such that each heater reaches a set temperature set for each of the divided regions.

3. The plasma processing apparatus according to claim 2, wherein a temperature sensor capable of detecting the temperature of each heater is provided in each of the divided regions.

4. The plasma processing apparatus according to claim 2, wherein the divided regions include a circular region at the center and a plurality of concentric annular regions surrounding the circular region.

5. The plasma processing apparatus according to claim 2, wherein angular widths of the divided regions are reduced towards an outer circumference of the placement surface of the placement table.

6. The plasma processing apparatus according to claim 2, wherein radial widths of the divided regions are reduced towards an outer circumference of the placement surface of the placement table.

7. The plasma processing apparatus according to claim 1, wherein the power monitor measures the power in a transient state where the power supplied to the heater decreases after the plasma is ignited as the power in the ignited state.

8. The plasma processing apparatus according to claim 1, wherein when a set temperature of the heater which is calculated by the set temperature calculator is deviated from a set temperature of the heater at which the workpiece reaches the target temperature, the heater controller controls the power supplied to the heater such that the temperature of the heater becomes the set temperature of the heater which is calculated by the set temperature calculator.

9. The plasma processing apparatus according to claim 8, wherein the heater controller performs the control of the power supplied to the heater continuously from a process of measuring the power supplied to each heater when the plasma is ignited to the ignited state where the plasma is maintained in the ignited state.

10. The plasma processing apparatus according to claim 9, wherein the heater controller performs the control of the power supplied to the heater at the timing when the plasma processing is completed and the workpiece is replaced.

11. The plasma processing apparatus according to claim 1, wherein the power monitor measures the power supplied in a predetermined cycle,
the parameter calculator calculates each of the heat input amount and the thermal resistance in every predetermined cycle using the measured power, and
the plasma processing apparatus further comprises an alarm configured to issue an alarm based on a change of at least one of the heat input amount and the thermal resistance calculated by the parameter calculator.

12. The plasma processing apparatus according to claim 1, further comprising a storage configured to store the heat input amount and the thermal resistance,
wherein the set temperature calculator calculates the set temperature of the heater at which the workpiece reaches the target temperature using the heat input amount and the thermal resistance stored in the storage, and when the set temperature is deviated from a set temperature calculated from the heat input amount and the thermal resistance calculated by the parameter calculator by a predetermined amount or more, the set temperature calculator updates the heat input amount and the thermal resistance stored in the storage to the heat input amount and the thermal resistance calculated by the parameter calculator.

13. A temperature control method comprising:
measuring power, which is supplied to a heater provided in a placement table of a plasma processing apparatus and configured to adjust a temperature of a placement surface of the placement table on which a workpiece serving as a plasma processing target is placed, in a non-ignited state where plasma is not ignited and in an ignited state where the plasma is ignited, while the power supplied to the heater is controlled such that a temperature of the heater becomes a constant temperature;
calculating a heat input amount from plasma and a thermal resistance between the workpiece and the heater by using the measured power supplied in the non-ignited state and in the ignited state; and
calculating the set temperature of the heater at which the workpiece reaches a target temperature using the calculated heat input amount and thermal resistance.

14. A non-transitory computer-readable storage medium that stores a temperature control program that causes a computer to execute a temperature control process including:
measuring power, which is supplied to a heater provided in a placement table of a plasma processing apparatus and configured to adjust a temperature of a placement surface of the placement table on which a workpiece serving as a plasma processing target is placed, in a non-ignited state where plasma is not ignited and in an ignited state after the plasma is ignited, while the power supplied to the heater is controlled such that a temperature of the heater becomes a constant temperature;
calculating a heat input amount from plasma and a thermal resistance between the workpiece and the heater by using the measured power supplied in the non-ignited state and in the ignited state; and calculating the set temperature of the heater at which the workpiece reaches a target temperature using the calculated heat input amount and thermal resistance.

\* \* \* \* \*